(12) United States Patent
Basker et al.

(10) Patent No.: US 9,390,981 B1
(45) Date of Patent: Jul. 12, 2016

(54) METHOD OF FORMING A COMPLEMENTARY METAL OXIDE SEMICONDUCTOR STRUCTURE WITH N-TYPE AND P-TYPE FIELD EFFECT TRANSISTORS HAVING SYMMETRIC SOURCE/DRAIN JUNCTIONS AND OPTIONAL DUAL SILICIDES

(71) Applicant: GLOBALFOUNDRIES U.S. 2 LLC, Hopewell Junction, NY (US)

(72) Inventors: Veeraraghavan S. Basker, Schenectady, NY (US); Andres Bryant, Burlington, VT (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/614,489

(22) Filed: Feb. 5, 2015

(51) Int. Cl.
  *H01L 21/00* (2006.01)
  *H01L 21/8238* (2006.01)
  *H01L 27/092* (2006.01)

(52) U.S. Cl.
  CPC .... *H01L 21/823814* (2013.01); *H01L 21/8238* (2013.01); *H01L 21/823864* (2013.01); *H01L 27/092* (2013.01)

(58) Field of Classification Search
  CPC ............... H01L 21/8238; H01L 21/823814; H01L 21/823864
  USPC .................................. 438/153, 154, 199, 300
  See application file for complete search history.

(56) References Cited

U.S. PATENT DOCUMENTS

| | | | |
|---|---|---|---|
| 7,067,368 B1 | 6/2006 | Fang et al. | |
| 7,544,575 B2 | 6/2009 | Adetutu et al. | |
| 8,053,809 B2 | 11/2011 | Cheng et al. | |
| 9,263,466 B2 * | 2/2016 | Cheng | H01L 21/823814 |
| 2005/0156208 A1 | 7/2005 | Lin et al. | |
| 2006/0163670 A1 | 7/2006 | Ellis-Monaghan et al. | |
| 2011/0147855 A1 | 6/2011 | Joshi et al. | |
| 2011/0309446 A1 * | 12/2011 | Doris | H01L 21/84 257/351 |
| 2014/0106529 A1 | 4/2014 | Morin et al. | |
| 2014/0210011 A1 | 7/2014 | Baraskar et al. | |
| 2014/0306290 A1 | 10/2014 | Alptekin et al. | |
| 2015/0093861 A1 * | 4/2015 | Loubet | H01L 21/84 438/154 |
| 2016/0035843 A1 * | 2/2016 | Vinet | H01L 21/84 438/154 |

OTHER PUBLICATIONS

Sinha et al., "Nickel-Silicide Contact Technology With Dual Near-Band-Edge Barrier Heights and Integration in CMOS FinFETs With Single Mask", IEEE Electron Device Letters, vol. 31, No. 9, Sep. 2010, pp. 918-920.

Zollner et al., Dual Silicide SOI CMOS Integration with Low-Resistance PTSI PMOS Contact, IEEE International SOI Conference Proceedings, 2007, pp. 75-76.

* cited by examiner

*Primary Examiner* — Matthew E Warren
(74) *Attorney, Agent, or Firm* — Gibb & Riley, LLC; Michael J. LeStrange, Esq.

(57) ABSTRACT

In a method of forming a semiconductor structure, different sections of a dielectric layer are etched at different stages during processing to form a first gate sidewall spacer for a first FET (e.g., a NFET) and a second gate sidewall spacer for a second FET (e.g., a PFET) such that the first and second gate sidewall spacers are symmetric. Raised source/drain regions for the first FET are formed immediately following first gate sidewall spacer formation and raised source/drain regions for the second FET are formed immediately following second gate sidewall spacer formation. Since the gate sidewall spacers of the two FETs are symmetric, the source/drain junctions of the two FETs will also be symmetric. Additionally, due to an etch stop layer formed on the raised source/drain regions of the first FET, but not the second FET, different metal silicides on the raised source/drain regions of the different FETs.

11 Claims, 25 Drawing Sheets

METHOD OF FORMING A COMPLEMENTARY METAL OXIDE SEMICONDUCTOR STRUCTURE WITH N-TYPE AND P-TYPE FIELD EFFECT TRANSISTORS HAVING SYMMETRIC SOURCE/DRAIN JUNCTIONS AND OPTIONAL DUAL SILICIDES

BACKGROUND

The present disclosure relates to semiconductor structures and, more particularly, to a method of forming a complementary metal oxide semiconductor (CMOS) structure with N-type and P-type field effect transistors (FETs) having symmetric source/drain junctions and, optionally, dual silicides.

Generally, CMOS structures incorporate FETS having different type conductivities (e.g., a N-type field effect transistor (NFET) and a P-type field effect transistor (PFET)). Because P-type and N-type FETs are different in many respects, oftentimes a first region of a substrate (e.g., a region on which NFET(s) are being formed) undergoes processing, while a second region of the substrate (e.g., a region on which PFET(s) are being formed) is masked (e.g., with a lithographically patterned photoresist mask) and vice versa. For example, during epitaxial deposition of raised source/drain regions on FET(s) in the first region, the second region may be masked, and vice-versa. By using discrete epitaxial deposition processes, different dopants, which are optimal for the specific type conductivity of the FET(s) being formed, can be used to in situ dope the raised source/drain regions. Similarly, during metal silicide formation on the source/drain regions of FET(s) in the first region, the second region can be masked and vice-versa. By using discrete metal silicide formation processes, different metals, which are optimal for the specific type conductivity of the FET(s) being formed, can be used. However, using multiple masks and, particularly, photoresist masks and performing discrete processing on different regions of a substrate increase manufacturing costs and overall processing time. Additionally, performing discrete epitaxial deposition processes to form raised source/drain regions, as described above, inherently results in a CMOS structure wherein the NFET(s) and PFET(s) have gate sidewall spacers that are asymmetric (i.e., wherein the gate sidewall spacers on the NFET(s) have a different width than the gate sidewall spacers on the PFET(s)). Consequently, the NFET(s) and PFET(s) have source/drain junctions that are also asymmetric (i.e., have source/drain junctions with different lengths and, thereby different resistances).

SUMMARY

Disclosed herein is a method of forming a semiconductor structure and, particularly, a complementary metal oxide semiconductor (CMOS) structure. The method can comprise forming, on a substrate, a first semiconductor body for a first transistor and a second semiconductor body for a second transistor, having a different type conductivity than the first transistor. The method can further comprise forming a first gate structure on the first semiconductor body and a second gate structure on the second semiconductor body. A first dielectric layer can then be formed such that a first section of the first dielectric layer covers the first gate structure and first semiconductor body and a second section of the first dielectric layer covers the second gate structure and second semiconductor body. After the first dielectric layer is formed, a mask can be formed on the second section of the first dielectric layer above the second gate structure and the second semiconductor body such that the first section of the first dielectric layer is exposed.

Next, the first section of the first dielectric layer can be etched to form a first gate sidewall spacer on the first gate structure and to expose first source/drain regions of the first semiconductor body. Once the first gate sidewall spacer is formed and the first source/drain regions are exposed, first raised source/drain regions can be formed (e.g., epitaxially deposited and in situ doped with a first dopant) on the first source/drain regions such that the first gate sidewall spacer is between the first raised source/drain regions and the first gate structure. The mask can be removed.

After the mask is removed, a second dielectric layer can be formed on the first gate structure, first gate sidewall spacer and first raised source/drain regions of the first semiconductor body. This second dielectric layer can further be formed so as to extend over the second section of the first dielectric layer, which is above the second gate structure and the second semiconductor body. Additionally, a third dielectric layer can be formed so that it covers the second dielectric layer. It should be noted that the second dielectric layer can comprise a different dielectric material than the first and third dielectric layers.

An additional mask can be formed on the third dielectric layer above the first gate structure, first gate sidewall spacer and the first semiconductor body, exposing a portion of the third dielectric layer above the second section of the first dielectric layer and, thereby above the second gate structure and the second semiconductor body. The exposed section of the third dielectric layer and the section of the second dielectric layer below can be etched away, thereby exposing the second section of the first dielectric layer.

Next, the second section of the first dielectric layer can be etched to form a second gate sidewall spacer on the second gate structure and to expose second source/drain regions of the second semiconductor body. Since the first gate sidewall spacer and the second gate sidewall spacer are etched from the same first dielectric layer, they will have approximately equal thicknesses. Once the second gate sidewall spacer is formed and the second source/drain regions are exposed, second raised source/drain regions can be formed (e.g., epitaxially deposited and in situ doped with a second dopant that is different from the first dopant) on the second source/drain regions such that the second gate sidewall spacer is between the second raised source/drain regions and the second gate structure. After the second raised source/drain regions are formed, the additional mask can be removed.

In addition to the process steps described above, additional process steps can be performed in order to complete the CMOS structure and, in doing so, to optionally form dual silicides (i.e., different metal silicides) on the first and second raised source/drain regions of the first and second transistors, respectively. For example, a fourth dielectric layer can be formed on the remaining portion of the third dielectric layer above the first transistor and further extending over the second raised source/drain regions, the second gate sidewall spacer and the second gate structure. The fourth dielectric layer can comprise, for example, the same dielectric material as the first and/or third dielectric layer and, more specifically, can comprise a different dielectric material than the second dielectric layer. A fifth dielectric layer (e.g., a blanket layer of interlayer dielectric material) can then be formed so as to cover the fourth dielectric layer. Subsequently, multiple contact openings can be formed including first contact openings, which are aligned above the first raised source/drain regions and which extend to the second dielectric layer (which functions as an etch stop layer), and second contact openings, which are aligned above the second raised source/drain regions and which extend to the second raised source/drain regions. Metal silicide layers can be formed on the exposed surfaces of the second raised source/drain regions of the second transistor within the second contact openings. Then, the second dielectric layer at the bottom of the first contact openings can be opened up (i.e., etched away) to expose the first raised source/drain regions. That is, the first contact openings can be extended through the second dielectric layer to the first raised source/drain regions. Then, additional metal silicide layers, which are different from the metal silicide layers on the second raised source/drain regions, can be formed on the exposed surfaces of the first raised source/drain regions within the first contact openings.

Also disclosed herein is semiconductor structure and, particularly, a complementary metal oxide semiconductor (CMOS) formed according to the method described above. This CMOS structure can comprise a substrate and a plurality of transistors above the substrate. The transistors can comprise at least a first transistor and a second transistor, having different type conductivities. The first transistor can comprise a first semiconductor body comprising first source/drain regions and a first channel region between the first source/drain regions. The first transistor can further comprise a first gate structure adjacent to the first channel region, first raised source/drain regions on the first source/drain regions, and a first gate sidewall spacer between the first raised source/drain regions and the first gate structure. The second transistor can comprise a second semiconductor body comprising second source/drain regions and a second channel region between the first source/drain regions. The second transistor can further comprise a second gate structure adjacent to the second channel region, second raised source/drain regions on the second source/drain regions, and a second gate sidewall spacer between the second raised source/drain regions and the second gate structure. The first gate sidewall spacer of the first transistor and the second gate sidewall spacer of the second transistor can comprise discrete portions of the same first dielectric layer, as described in detail above with regard to the method. Thus, the first gate sidewall spacer and the second gate sidewall spacer have approximately equal thicknesses and, as a result, the first raised source/drain regions are separated from the first channel region and the second raised source/drain regions are separated from the second channel region by approximately equal distances. In other words, the first transistor and the second transistor will have symmetric gate sidewall spacers and, thereby symmetric source/drain junctions.

The CMOS structure can further comprise a plurality of additional dielectric layers. The additional dielectric layers can comprise at least a second dielectric layer, a third dielectric layer and a fourth dielectric layer. The second dielectric layer can be above the first transistor and, specifically, immediately adjacent to the first raised source/drain regions of the first transistor without extending over the second transistor. The third dielectric layer can be on the second dielectric layer above the first transistor, again without extending over the second transistor. The fourth dielectric layer can be on the third dielectric layer and can further extend laterally over the second transistor so as to be immediately adjacent to the second raised source/drain regions. The second dielectric layer can specifically comprise a different dielectric material than that used for the first, third and fourth dielectric layers.

Optionally, the first transistor and the second transistor can have dual silicides (i.e., different metal silicides on the first raised source/drain regions and the second raised source/drain regions, respectively).

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
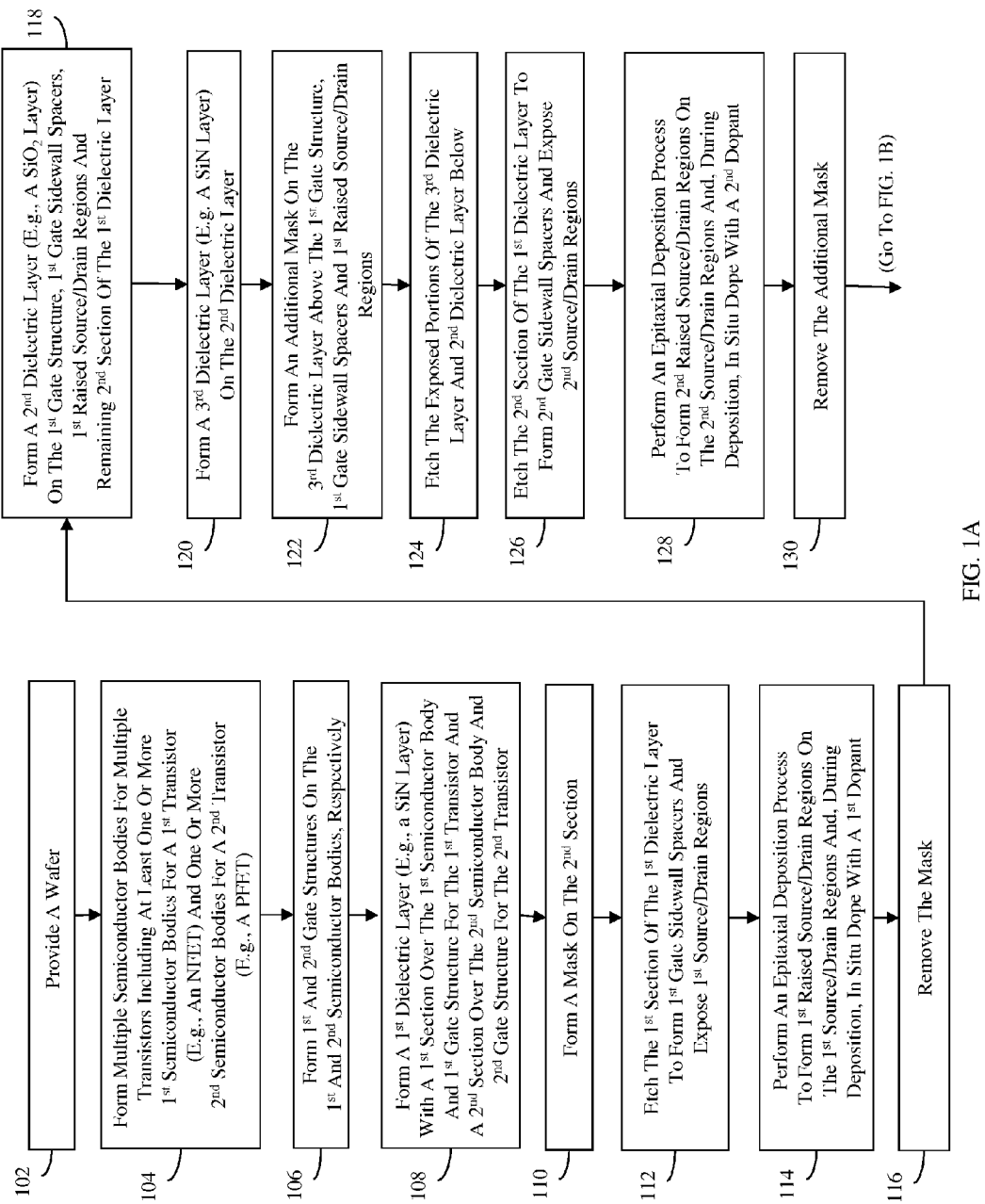
FIGS. 1A-1B illustrate a flow diagram of a method of forming a CMOS structure.

As mentioned above, complementary metal oxide semiconductor (CMOS) structures typically incorporate at least two FETs having different type conductivities (e.g., a N-type field effect transistor (NFET) and a P-type field effect transistor (PFET)). Because P-type and N-type FETs are different in many respects, oftentimes a first region of a substrate (e.g., a region on which NFET(s) are being formed) undergoes processing, while a second region of the substrate (e.g., a region on which PFET(s) are being formed) is masked (e.g., with a lithographically patterned photoresist mask) and vice versa. For example, during epitaxial deposition of raised source/drain regions on FET(s) in the first region, the second region may be masked, and vice-versa. By using discrete epitaxial deposition processes, different dopants, which are optimal for the specific type conductivity of the FET(s) being formed, can be used to in situ dope the raised source/drain regions. Similarly, during metal silicide formation on the source/drain regions of FET(s) in the first region, the second region can be masked and vice-versa. By using discrete metal silicide formation processes, different metals, which are optimal for the specific type conductivity of the FET(s) being formed, can be used. However, using multiple masks and, particularly, photoresist masks and performing discrete processing on different regions of a substrate increase manufacturing costs and overall processing time. Additionally, performing discrete epitaxial deposition processes to form raised source/drain regions, as described above, inherently results in a CMOS structure wherein the NFET(s) and PFET(s) have gate sidewall spacers that are asymmetric and, thereby source/drain junctions that are also asymmetric.

In view of the foregoing, disclosed herein is a method of forming a semiconductor structure and, particularly, a complementary metal oxide semiconductor (CMOS) structure. In the method, different sections of a dielectric layer are etched at different stages during processing to form a first gate sidewall spacer for a first FET (e.g., a NFET) and a second gate sidewall spacer for a second FET (e.g., a PFET) such that the first and second gate sidewall spacers are symmetric. Raised source/drain regions for the first FET are formed immediately following first gate sidewall spacer formation and raised source/drain regions for the second FET are formed immediately following second gate sidewall spacer formation. Since the gate sidewall spacers of the two FETs are symmetric, the source/drain junctions of the two FETs will also be symmetric. Additionally, in the method, an etch stop layer can be formed and etched such that it is present on the first FET, but not the second FET. During formation of contact openings, this etch stop layer can be used to prevent exposure of the raised source/drain regions of the first FET, thereby allowing metal silicide layers to be formed on the raised source/drain regions of the second FET. Subsequently, the raised source/drain regions of the first FET can be exposed and a different metal silicide can be formed thereon. Thus, the method achieves a CMOS structure wherein the NFET(s) and PFET(s) have symmetric gate sidewall spacers and, optionally, dual silicides and does so with fewer masks, thereby decreasing manufacturing costs and overall processing time.

Figure 1B:
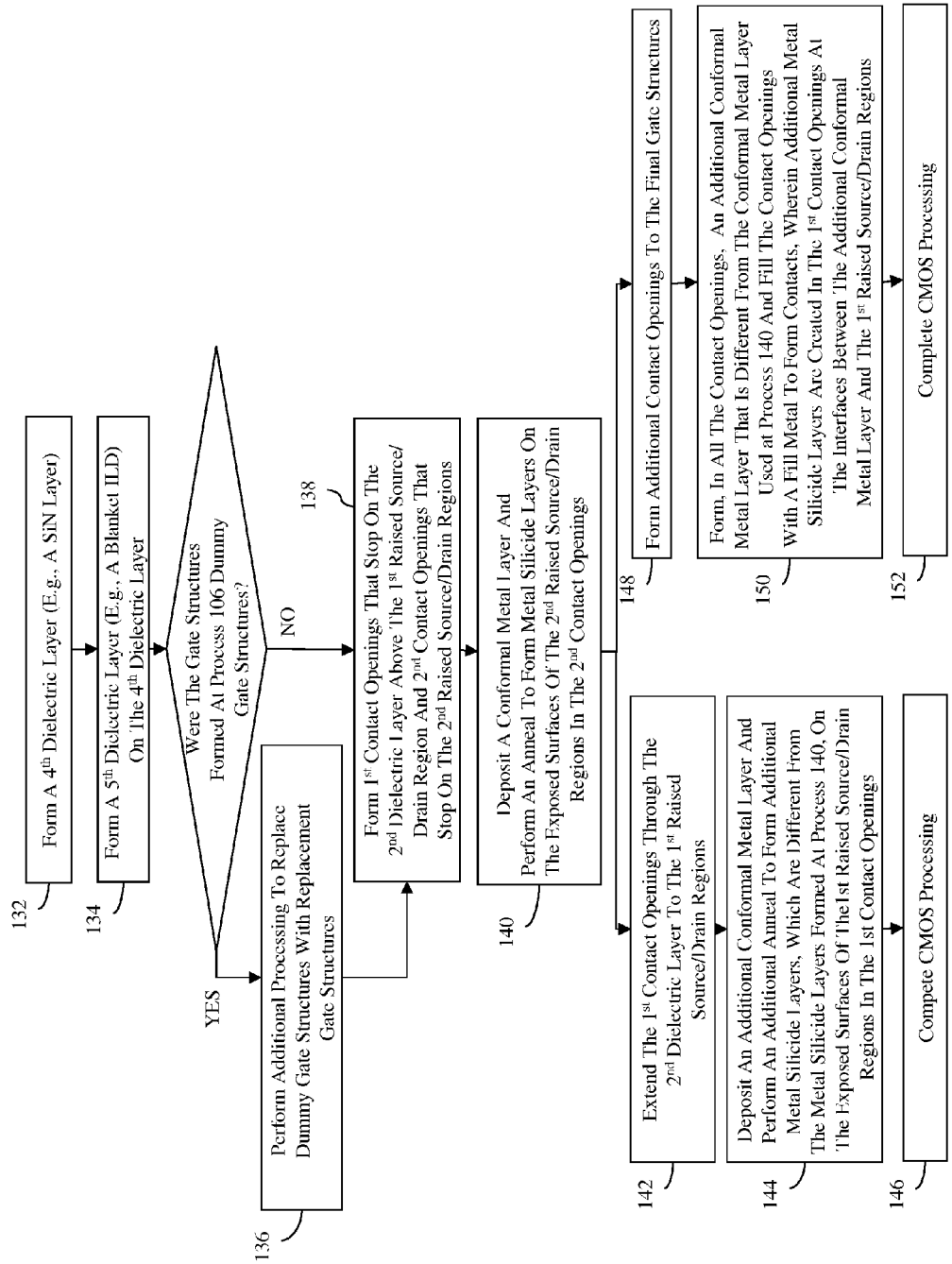

More particularly, referring to the flow diagram of FIGS. 1A-1B, disclosed herein is a method of forming a semiconductor structure and, particularly, a complementary metal oxide semiconductor (CMOS) structure. Specifically, referring to FIG. 1A, the method can comprise providing a wafer (102). The wafer can comprise a semiconductor-on-insulator (SOI) wafer comprising, for example, a semiconductor substrate 201 (e.g., a silicon substrate or any other suitable semiconductor substrate), an insulator layer 202 (e.g., a silicon dioxide layer, a silicon nitride layer, a silicon oxynitride layer or any other suitable insulator layer) on the semiconductor substrate 201 and a semiconductor layer (e.g., a silicon layer, a silicon germanium layer, or any other suitable semiconductor layer) on the insulator layer 202. Alternatively, the wafer can comprise a bulk semiconductor wafer comprising, for example, a bulk semiconductor substrate (e.g., a bulk silicon substrate or any other suitable bulk semiconductor substrate). Optionally, in the case of a bulk semiconductor wafer, a dopant implantation process can be performed in order to form a buried well region that isolates the upper portion of the substrate from the lower portion of the substrate. For purposes of illustration, this method is described below and illustrated in the Figures with respect to an SOI wafer.

The method can further comprise forming, on the wafer, multiple semiconductor bodies for multiple field effect transistors (FETs) including forming at least one or more first semiconductor bodies 219 for a first transistor 210 (e.g., a N-type field effect transistor (NFET)) and one or more second semiconductor bodies 229 for a second transistor 220 (e.g., a P-type field effect transistor (PFET)), having a different type conductivity than the first transistor 210 (104). The semiconductor bodies 219, 229 can comprise non-planar semiconductor bodies for non-planar FETs, such as dual-gate FETs (also referred to herein as fin-type field effect transistors (finFETs)) or tri-gate FETs. Alternatively, the semiconductor bodies 219, 229 can comprise planar semiconductor bodies for planar FETs such as extremely thin silicon-on-insulator FETs. Techniques for forming non-planar semiconductor bodies and planar semiconductor bodies (e.g., from the semiconductor layer above an insulator layer 202 of an SOI wafer or from the upper portion of a bulk semiconductor wafer) are well known in the art and, thus, the details of such techniques are omitted from this specification in order to allow the reader to focus on the salient aspects of the disclosed method. For purposes of illustration, the method is described below and illustrated in the Figures with respect to non-planar semiconductor bodies used in the formation of non-planar FETs. Furthermore, for purposes of illustration, the method is described below and shown in the Figures with respect to FETs each incorporating a single semiconductor body. However, it should be understood that the Figures are not intended to be limiting. Thus, for example, the process steps described below could be performed with respect to planar semiconductor bodies used in the formation of planar FETs and/or with respect to FETs that each incorporates multiple essentially parallel semiconductor bodies.

Figure 2:
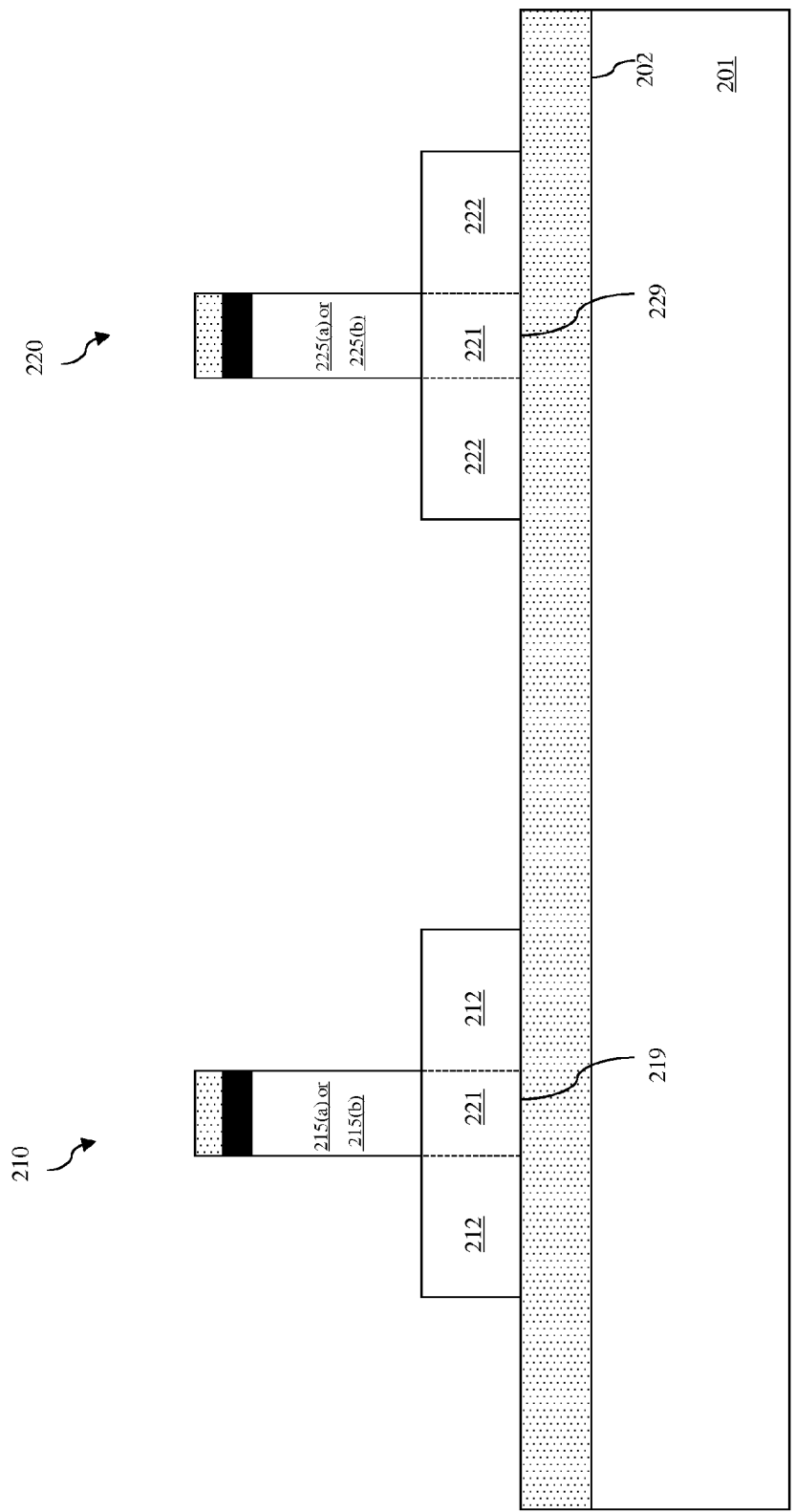
FIG. 2 is a partially completed CMOS structure formed according to the method of FIGS. 1A-1B.

In any case, the first semiconductor body 219 can have first source/drain regions 212 and a first channel region 211 positioned laterally between the first source/drain regions 212. Similarly, the second semiconductor body 229 can have second source/drain regions 222 and a second channel region 221 positioned laterally between the second source/drain regions 222. The method can further comprise forming a first gate structure adjacent to the first channel region 211 in the first semiconductor body 219 and a second gate structure adjacent to the second channel region 221 in the second semiconductor body 229 (106, see FIG. 2). These gate structures can each comprise a plurality of dielectric caps (e.g., a nitride cap and an oxide cap above the nitride cap).

The first gate structure and second gate structure formed at process 106 can comprise, for example, conventional gate structures 215(*a*) and 225(*a*) formed using conventional gate processing techniques (referred to herein as gate first processing techniques). To form such conventional gate structures, one or more gate dielectric layers (e.g., a silicon dioxide gate dielectric layer or any other suitable gate dielectric layer) can deposited over the first semiconductor body 219 and the second semiconductor body 229. Then, one or more gate conductor layers (e.g., a polysilicon gate conductor layer or other suitable gate conductor layer) can be deposited over the gate dielectric layer(s) and multiple dielectric cap layers (e.g., a silicon nitride cap layer and a silicon dioxide cap layer) can be deposited on the gate conductor layer(s) in order to form a gate stack. The gate stack can then be lithographically patterned and etched to form multiple conventional gate structures and, particularly, a first gate structure 215(a) on the first semiconductor body 219 (e.g., on the top surface and, in the case of a non-planar semiconductor body 219, also on the opposing sidewalls) at the first channel region 211 and a second gate structure 225(a) on the second semiconductor body 229 (e.g., on the top surface and, in the case of a non-planar semiconductor body 229, also on the opposing sides) at the second channel region 221. Such conventional gate structures 215(a) and 225(a) will function as the final gate structures in the first and second transistors 210 and 220 of the resulting CMOS structure.

Alternatively, the first gate structure and second gate structure formed at process 106 can comprise, for example, dummy gate structures 215(b) and 225(b). To form such dummy gate structures, a blanket layer of a dummy gate material (e.g., a semiconductor material, such as silicon, polysilicon, or amorphous silicon, or any other suitable dummy gate material) can be deposited over the first semiconductor body 219 and the second semiconductor body 229 and multiple dielectric cap layers (e.g., a silicon nitride cap layer and a silicon dioxide cap layer) can be deposited on the dummy gate material in order to form a dummy gate stack. This dummy gate stack can then be lithographically patterned and etched to form multiple dummy gate structures and, particularly, a first gate structure 215(b) on the first semiconductor body 219 (e.g., on the top surface and, in the case of a non-planar semiconductor body 219, on the opposing sidewalls) at the first channel region 211 and a second gate structure 225(b) on the second semiconductor body 229 (e.g., on the top surface and, in the case of a non-planar semiconductor body 229, on the opposing sides) at the second channel region 221. Such dummy gate structures 215(b) and 225(b) will subsequently be replaced during processing (e.g., see process 136 described in detail below and shown in FIG. 1B) with replacement gate structures (e.g., replacement metal gate structures), which will function as the final gate structures in the first and second transistors 210 and 220 of the resulting CMOS structure. For purposes of illustration, the method is further described below and illustrated in the Figures with respect to an embodiment wherein the first and second gate structures formed at process 106 are dummy gate structures 215(b) and 225(b).

Figure 3:
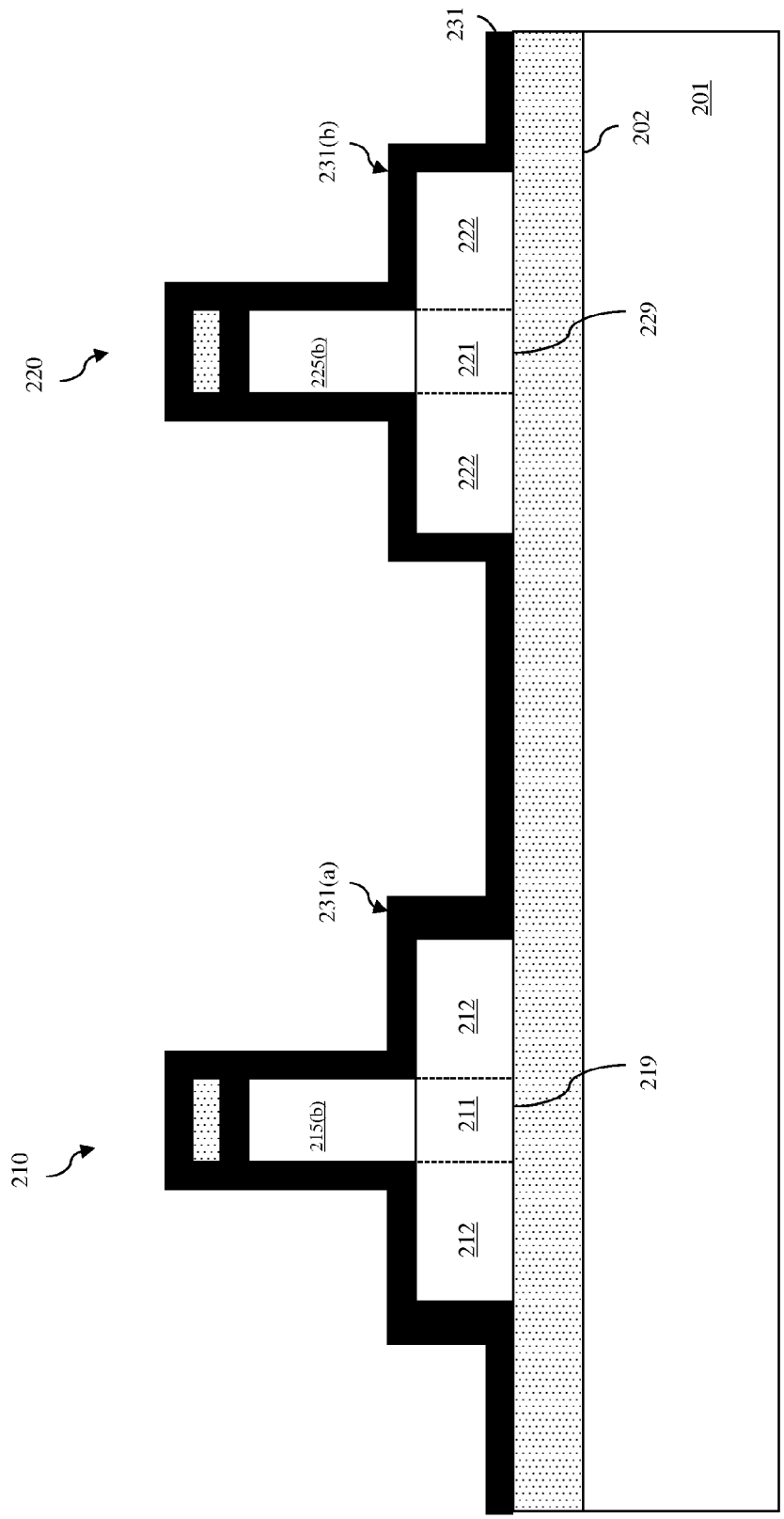
FIG. 3 is a partially completed CMOS structure formed according to the method of FIGS. 1A-1B.
Figure 4:
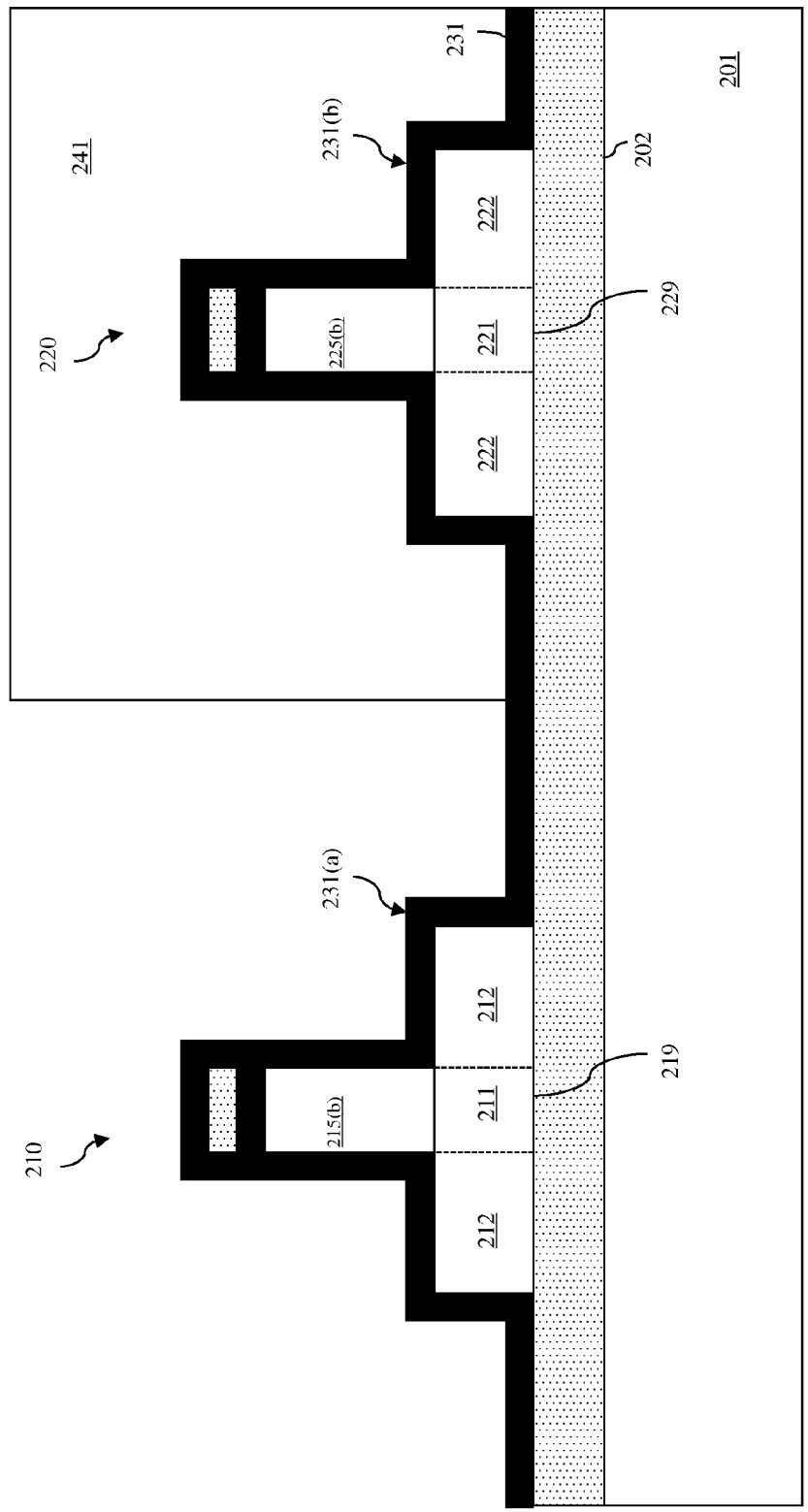
FIG. 4 is a partially completed CMOS structure formed according to the method of FIGS. 1A-1B.

Following gate structure formation at process 106, a first dielectric layer 231 can be formed (e.g., conformally deposited) such that a first section 231(a) of the first dielectric layer 231 covers the first gate structure 215(b) and the first source/drain regions 212 of the first semiconductor body 219 of the first transistor 210 (e.g., of the NFET) and such that a second section 231(b) of the first dielectric layer 231 covers the second gate structure 225(b) and the second source/drain regions 222 of the second semiconductor body 229 of the second transistor 220 (e.g., of the PFET) (108, see FIG. 3). This first dielectric layer 231 can comprise, for example, a silicon nitride layer and should be deposited such that it has an approximately uniform thickness (i.e., such that the thickness of the first section 231(a) is approximately equal to the thickness of the second section 231(b)). After the first dielectric layer 231 is formed at process 108, a mask 241 can be formed on the second section 231(b) of the first dielectric layer 231 above the second gate structure 225(b) and the second semiconductor body 229 of the second transistor 220 such that the first section 231(a) of the first dielectric layer 231 is exposed (110, see FIG. 4). For example, a photoresist layer can be deposited and lithographically patterned so as to form the mask 241, which covers the second section 231(b) of the first dielectric layer 231 and leaves the first section 231(a) exposed.

Figure 5:
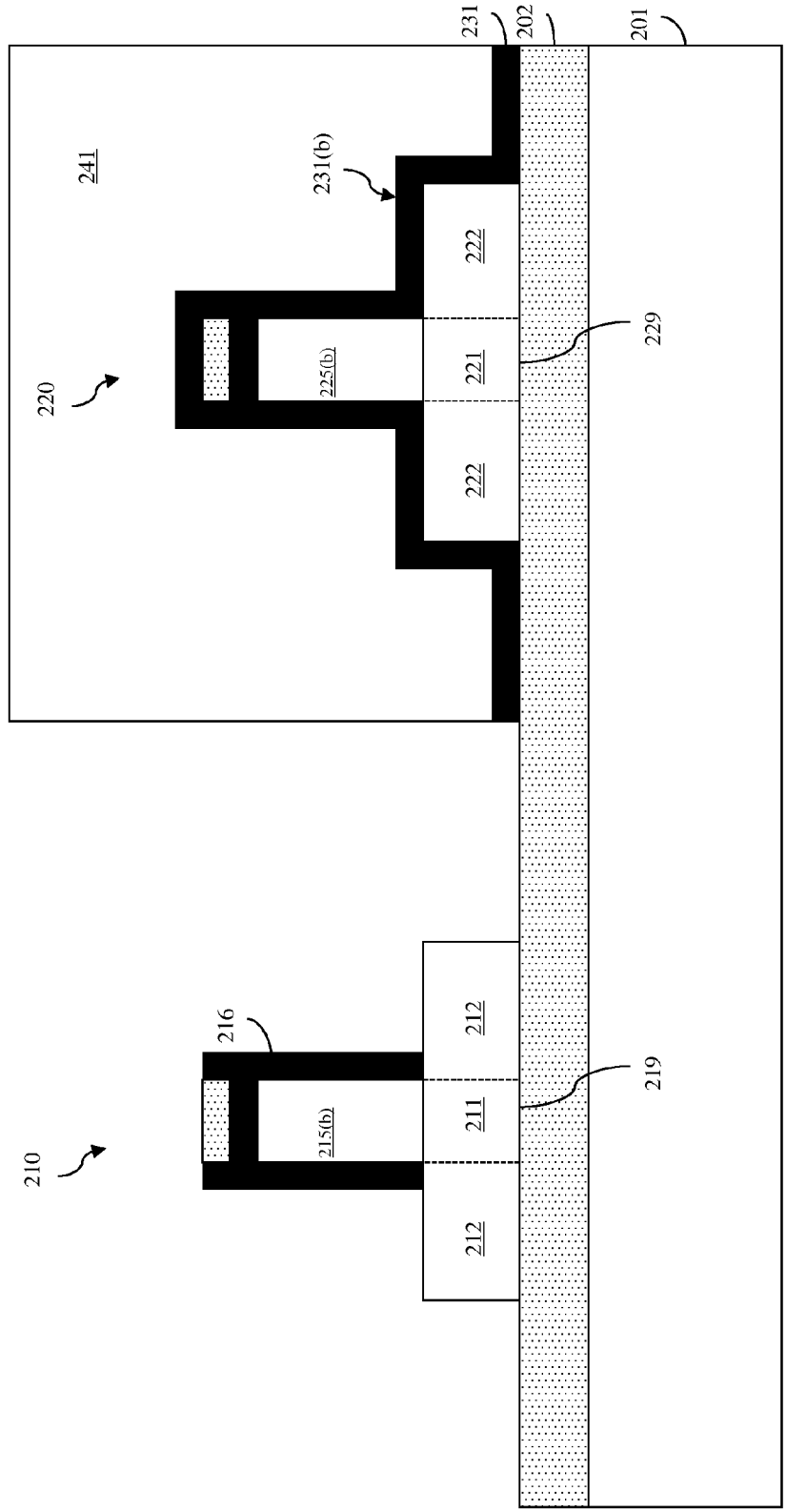
FIG. 5 is a partially completed CMOS structure formed according to the method of FIGS. 1A-1B.

Next, the first section 231(a) of the first dielectric layer 231 can be etched (e.g., using an anisotropic etch process) to form a first gate sidewall spacer 216 on the first gate structure 215(b) and to expose the first source/drain regions 212 of the first semiconductor body 219 (112, see FIG. 5). It should be noted that the thickness of the first dielectric layer 231 as well as the height of the first gate structure, including the thicknesses of the dielectric cap layers, should be predetermined to ensure that, during this anisotropic etch process, the first dielectric layer can be removed from the horizontal and vertical surfaces of the first semiconductor body 219 and still remain on the sidewalls of the first gate structure 215(b).

Figure 6:
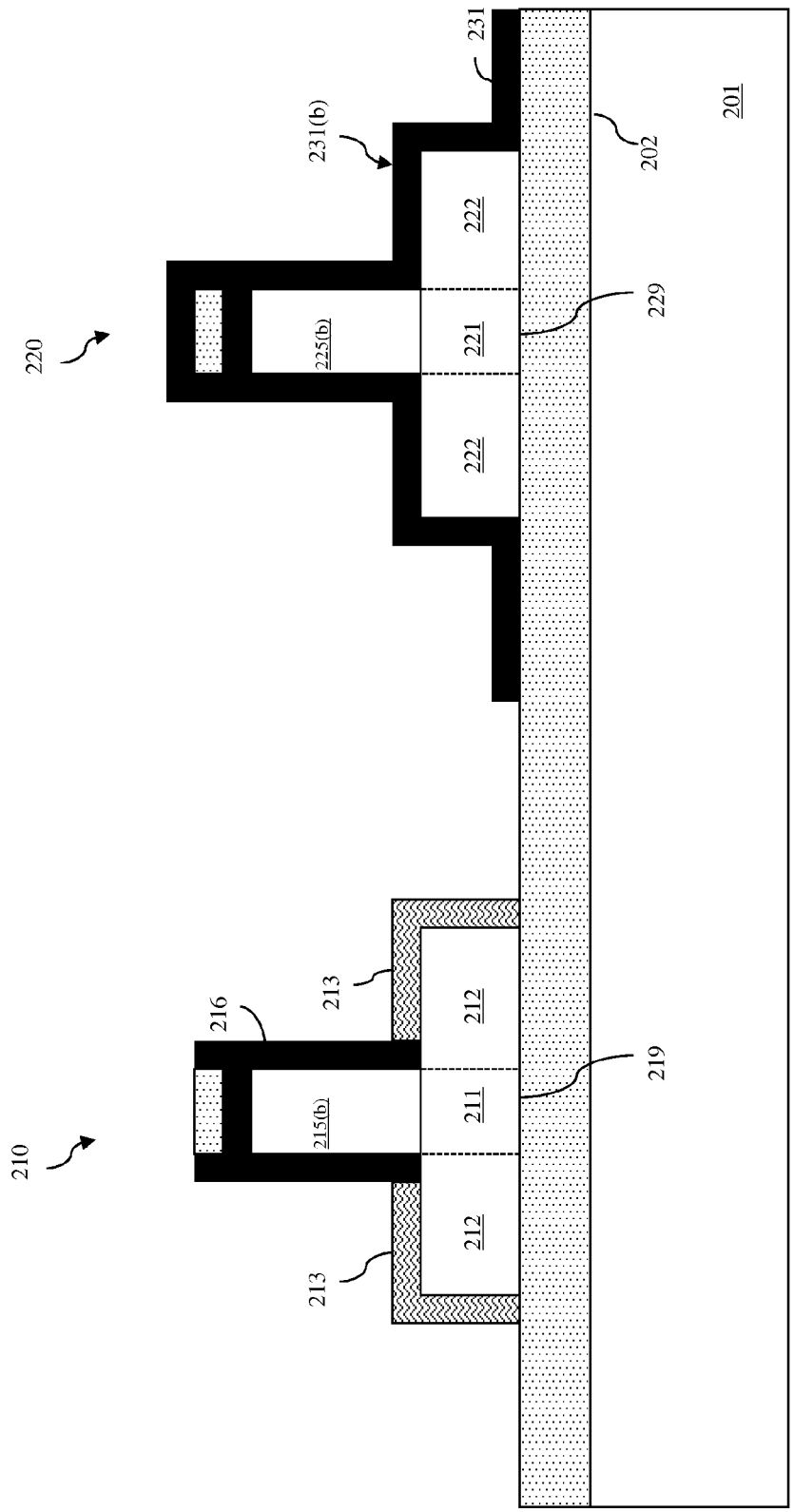
FIG. 6 is a partially completed CMOS structure formed according to the method of FIGS. 1A-1B.

Once the first gate sidewall spacer 216 is formed and the first source/drain regions 212 are exposed, first raised source/drain regions 213 can be formed on the first source/drain regions 212 such that the first gate sidewall spacer 216 is between the first raised source/drain regions 213 and the first gate structure 215(b) (114, see FIG. 6). The first raised source/drain regions 213 can be formed, for example, by epitaxially depositing a first epitaxial silicon layer on the first source/drain regions 212. It should be understood that in the case of a non-planar transistor, this epitaxial silicon layer will be deposited on both the top surface and the opposing sidewalls of the semiconductor body (not shown). Furthermore, in the case of a transistor that incorporates multiple non-planar semiconductor bodies, this epitaxial silicon layer can merge (i.e., electrically connect) the source/drain regions of adjacent semiconductor bodies. During this epitaxial deposition process, the first epitaxial silicon layer can be in situ doped with a first dopant. For example, if the first transistor 210 is a NFET, the first dopant used to dope the first epitaxial silicon layer can comprise a N-type dopant (e.g., a Group V dopant, such as arsenic, phosphorous or antimony) such that the resulting first raised source/drain regions 213 are N-type raised source/drain regions. The mask 241 on the second section 231(b) of the first dielectric layer 231 can then be selectively removed (116).

Figure 7:
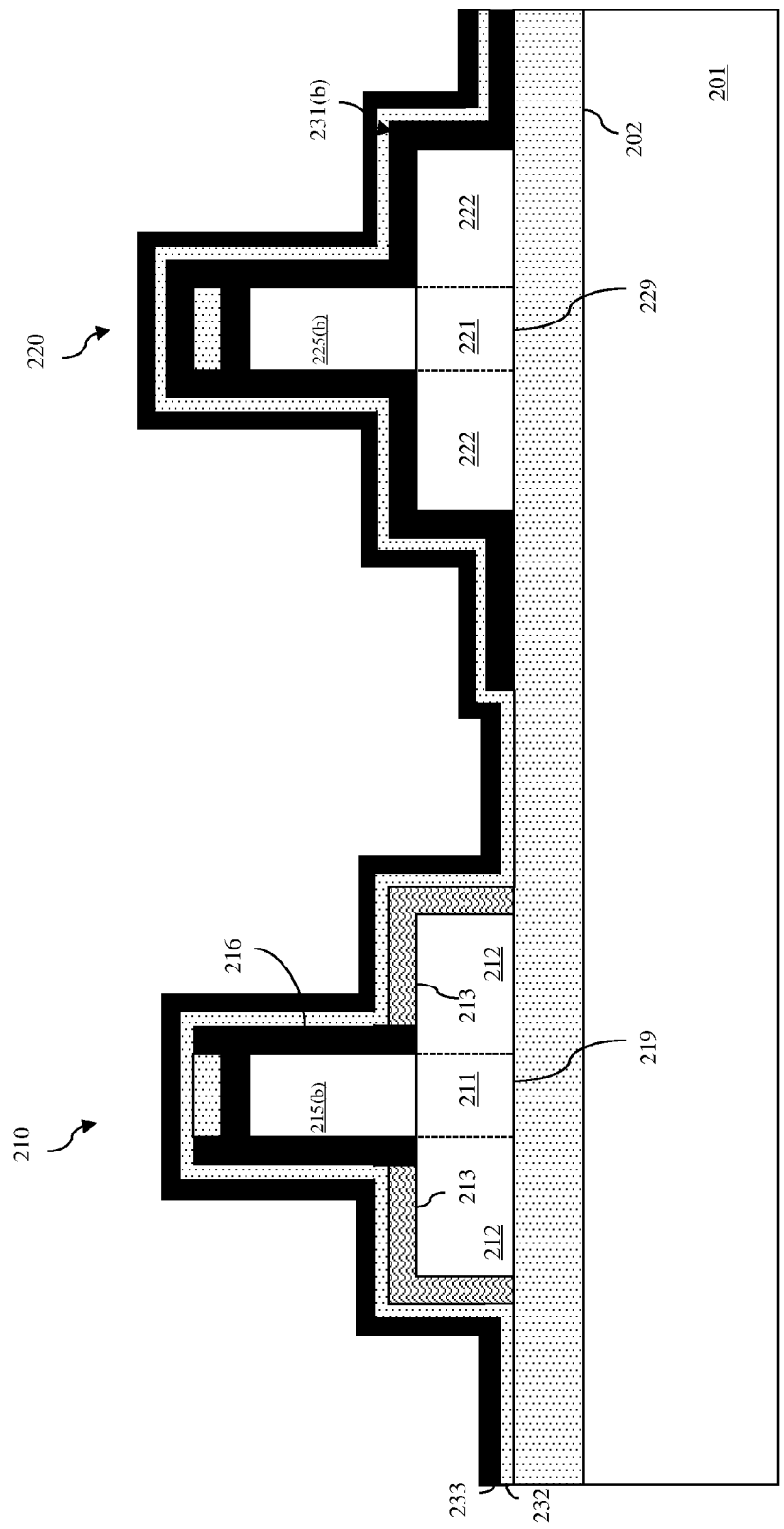
FIG. 7 is a partially completed CMOS structure formed according to the method of FIGS. 1A-1B.

After the mask 241 is removed, a second dielectric layer 232 can be formed (e.g., conformally deposited) (118, see FIG. 7). As a result, this second dielectric layer 232 will cover the first gate structure 215(b) and first gate sidewall spacer 216 and will also be immediately adjacent to the first raised source/drain regions 213 and, particularly, will be on the top surfaces of the first raised source/drain regions 213. This second dielectric layer 232 will also extend laterally over the second section 231(b) of the first dielectric layer 231, which is above the second gate structure 225(b) and the second source/drain regions 222 of the second semiconductor body 229. This second dielectric layer 232 can comprise a different dielectric material than the first dielectric layer 231. For example, the second dielectric layer 232 can comprise a silicon dioxide layer. Additionally, a third dielectric layer 233 can be formed (e.g., conformally deposited) so that it covers the second dielectric layer 232 (120, see FIG. 7). The third dielectric layer 233 can comprise a different dielectric material than the second dielectric layer 232 such that the second dielectric layer 232 can subsequently function as an etch stop layer at process 138 discussed in detail below. For example, the third dielectric layer 233 can comprise a silicon nitride layer.

Figure 8:
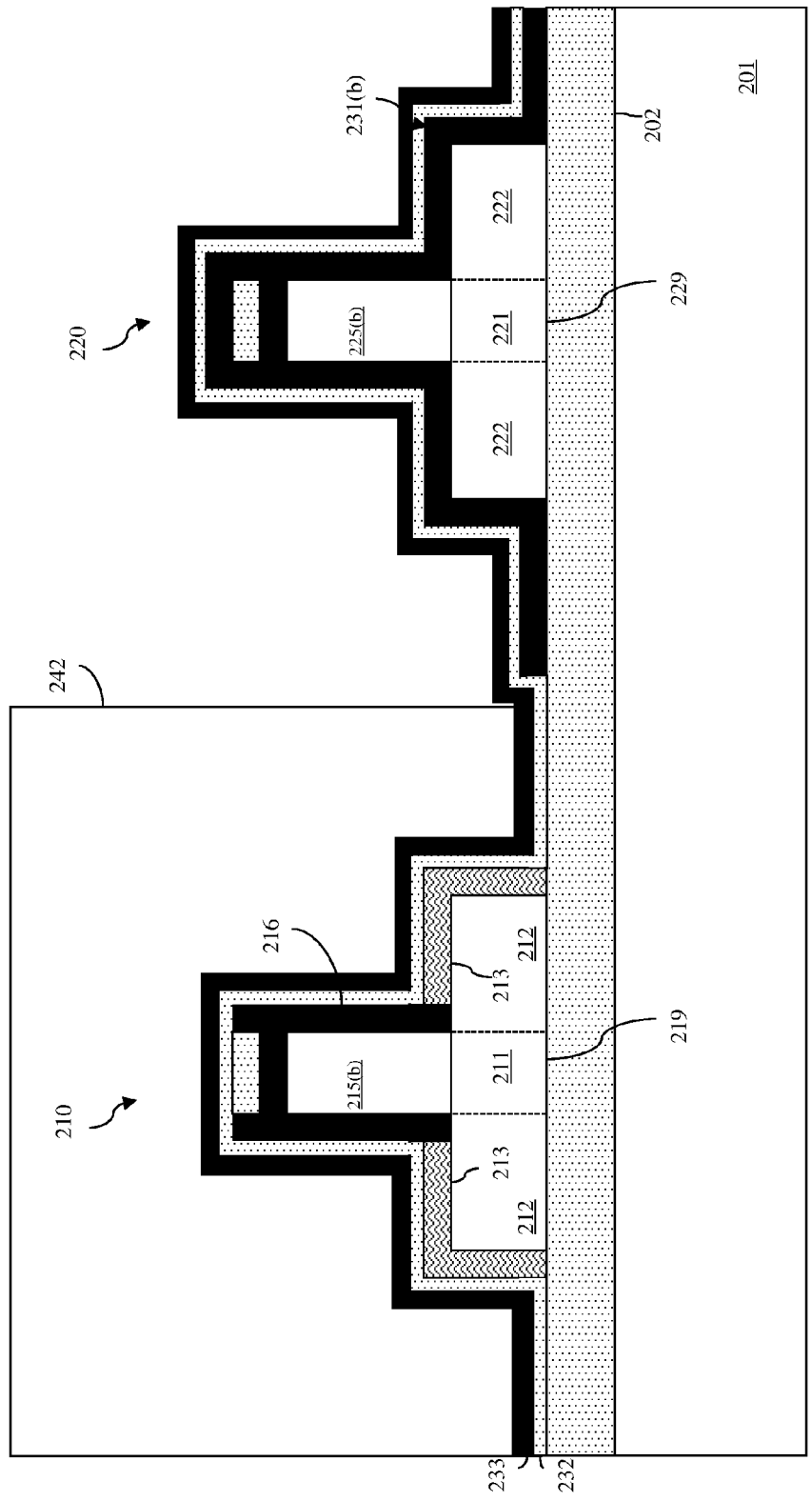
FIG. 8 is a partially completed CMOS structure formed according to the method of FIGS. 1A-1B.
Figure 9:
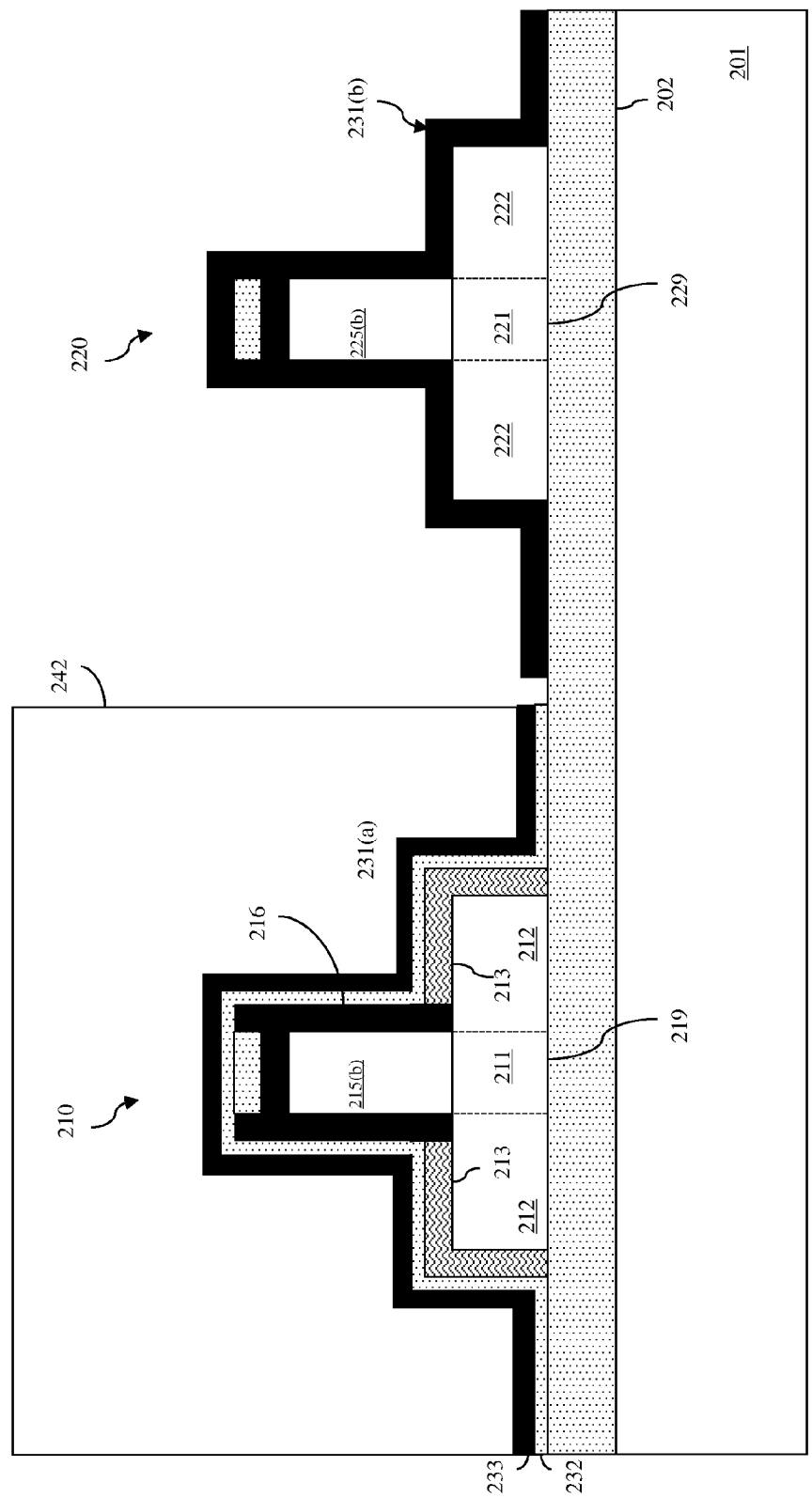
FIG. 9 is a partially completed CMOS structure formed according to the method of FIGS. 1A-1B.

An additional mask 242 can subsequently be formed on a section of the third dielectric layer 233 above the first gate structure 215(b), first gate sidewall spacer 216 and first raised source/drain regions 213, leaving an adjacent section of the third dielectric layer 233, which is above the second section 231(b) of the first dielectric layer and, thereby above the second gate structure 225(b) and the second semiconductor body 229, exposed (122, see FIG. 8). For example, an additional photoresist layer can be deposited and lithographically patterned so as to form the additional mask 242, which covers the section of the third dielectric layer 233 above the first transistor 210 and which leaves the section of the third dielectric layer 233 above the second transistor 220 exposed. The exposed section of the third dielectric layer 233 and the section of the second dielectric layer 232 below can be etched away, thereby exposing the second section 231(b) of the first dielectric layer 231 (124, see FIG. 9). The exposed section of the third dielectric layer 233 can be removed using, for example, an isotropic chemical dry etch (CDE) process. The section of the second dielectric layer 232 below can be removed using an etch process that is selective to the dielectric material used for that second dielectric layer 232 over the dielectric material used for the first dielectric layer 231. For example, when the second dielectric layer 232 comprises silicon dioxide and the first dielectric layer 231 comprises silicon nitride, the etch process can comprise an isotropic wet etch process (e.g., using hydrofluoric acid (HF)), a chemical oxide removal (COR) etch process, or any other suitable selective etch process.

Figure 10:
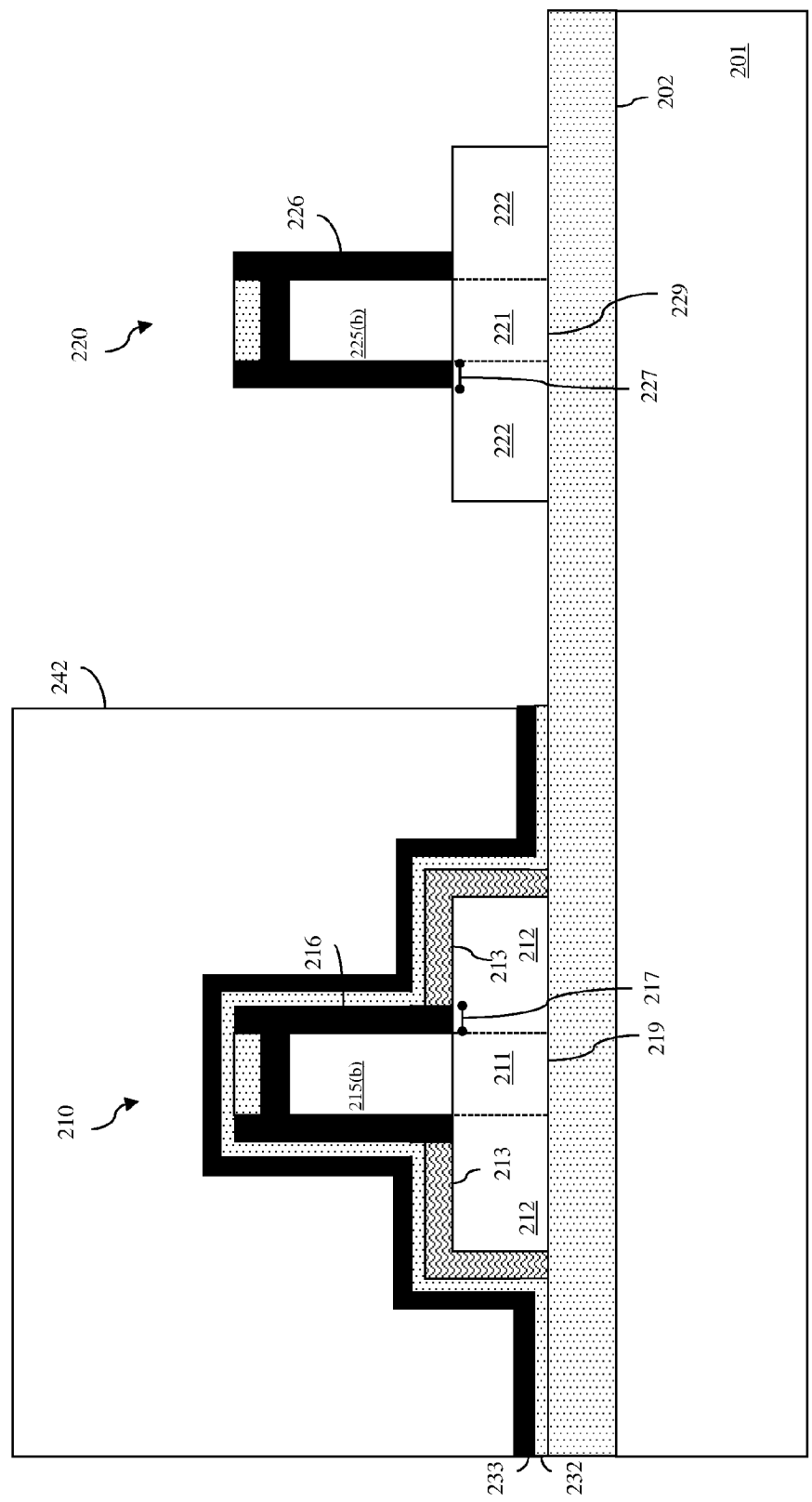
FIG. 10 is a partially completed CMOS structure formed according to the method of FIGS. 1A-1B.

Next, the second section 231(b) of the first dielectric layer 231 can be etched to form a second gate sidewall spacer 226 on the second gate structure 225(b) and to expose the second source/drain regions 222 of the second semiconductor body 229 (126, see FIG. 10). This etch process 126 should be essentially the same (e.g., the same anisotropic etch process) as that used at process 112 to form the first gate sidewall spacer 216. It should be noted that the thickness of the first dielectric layer 231 as well as the height of the second gate structure, including the thicknesses of the dielectric cap layers, should be predetermined to ensure that, during this anisotropic etch process, the first dielectric layer can be removed from the horizontal and vertical surfaces of the second semiconductor body 229 and still remain on the sidewalls of the first gate structure 215(b). Since the first gate sidewall spacers 216 and the second gate sidewall spacer 226 are etched from the same first dielectric layer 231 using essentially the same etch process, they will have approximately equal thicknesses. That is, the first gate sidewall spacer 216 on the first gate structure 215(a) will have a first thickness 217 and the second gate sidewall spacer 226 on the second gate structure 225(b) will have a second thickness 227 that is approximately equal to the first thickness 217. In other words, the first transistor 210 (e.g., the NFET) and second transistor 220 (e.g., the PFET) will have symmetric gate sidewall spacers.

Figure 11:
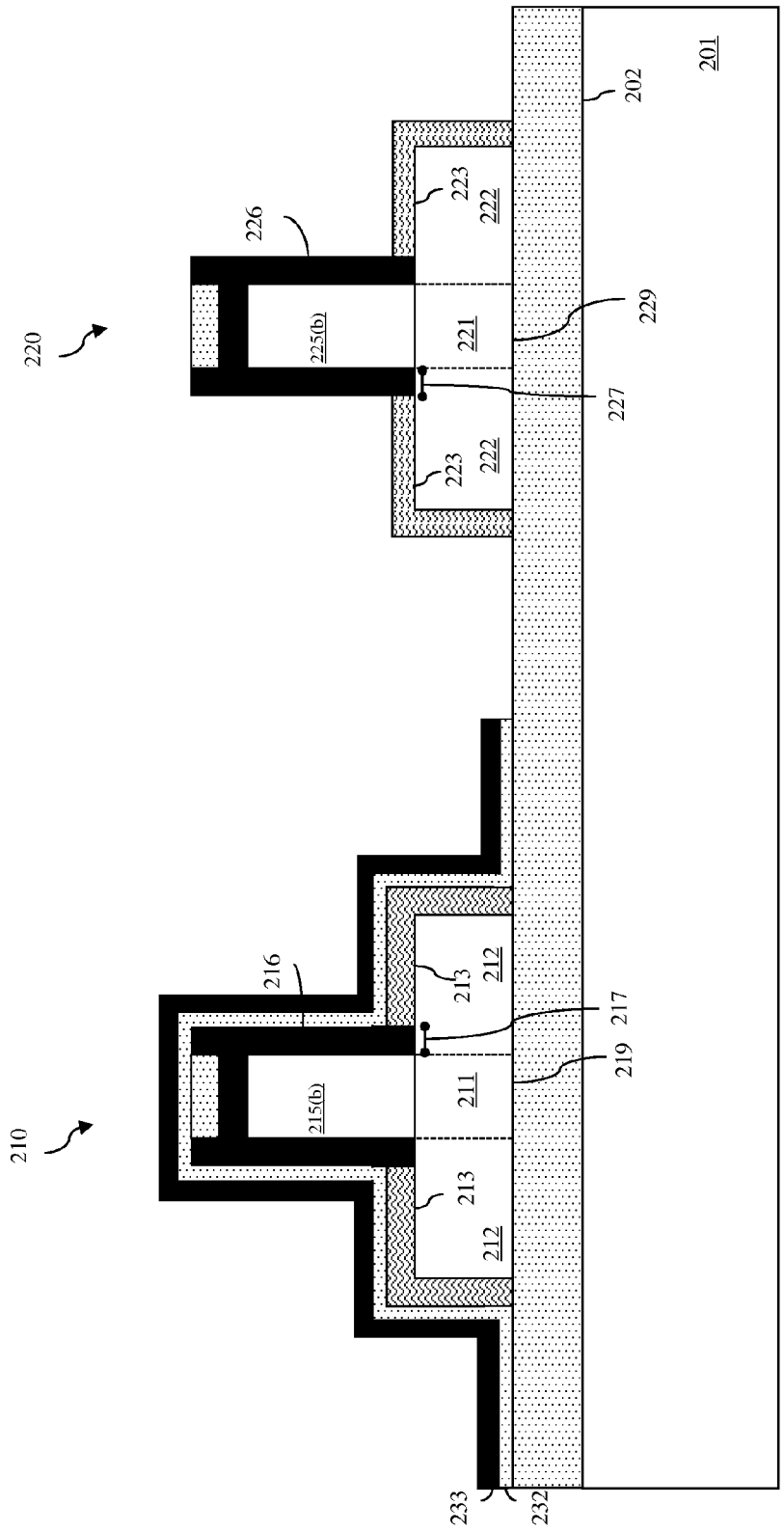
FIG. 11 is a partially completed CMOS structure formed according to the method of FIGS. 1A-1B.

Once the second gate sidewall spacer 226 is formed and the second source/drain regions 222 are exposed, second raised source/drain regions 223 can be formed on the second source/drain regions 222 (128, see FIG. 11). Specifically, the second raised source/drain regions 223 can be formed on the second source/drain regions 222 such that the second gate sidewall spacer 226 is between the second raised source/drain regions 223 and the second gate structure 225(b). The second raised source/drain regions 223 can be formed, for example, by epitaxially depositing a second epitaxial silicon layer on the second source/drain regions 222. It should be understood that in the case of a non-planar transistor, this epitaxial silicon layer would be deposited on both the top surface and the opposing sidewalls of the semiconductor body (not shown). Furthermore, in the case of a transistor that incorporates multiple non-planar semiconductor bodies, this epitaxial silicon layer can merge (i.e., electrically connect) the source/drain regions of adjacent semiconductor bodies. During this epitaxial deposition process, the second epitaxial silicon layer can be in situ doped with a second dopant that is different from the first dopant used to dope the first raised source/drain regions 213. For example, if the second transistor 220 is a PFET, the second dopant used to dope the second epitaxial silicon layer can comprise a P-type dopant (e.g., a Group III dopant, such as boron or indium) such that the resulting second raised source/drain regions 223 are P-type raised source/drain regions. The additional mask 242 can then be selectively removed (130).

Since the first transistor 210 (e.g., the NFET) and the second transistor 220 (e.g., the PFET) have symmetric gate sidewall spacers (i.e., gates sidewall spacers with approximately equal thicknesses 217 and 227, respectively), the first raised source/drain regions 213 will be separated from the first channel region 211 in the first semiconductor body 219 and the second raised source/drain regions 223 will be separated from the second channel region 221 in the second semiconductor body 219 by approximately equal distances. Thus, the first transistor 210 (e.g., the NFET) and the second transistor 220 (e.g., the PFET) will also have symmetric source/drain junctions (i.e., the source/drain junctions of the FETs will have approximately equal lengths and, thereby approximately equal resistances).

Figure 12:
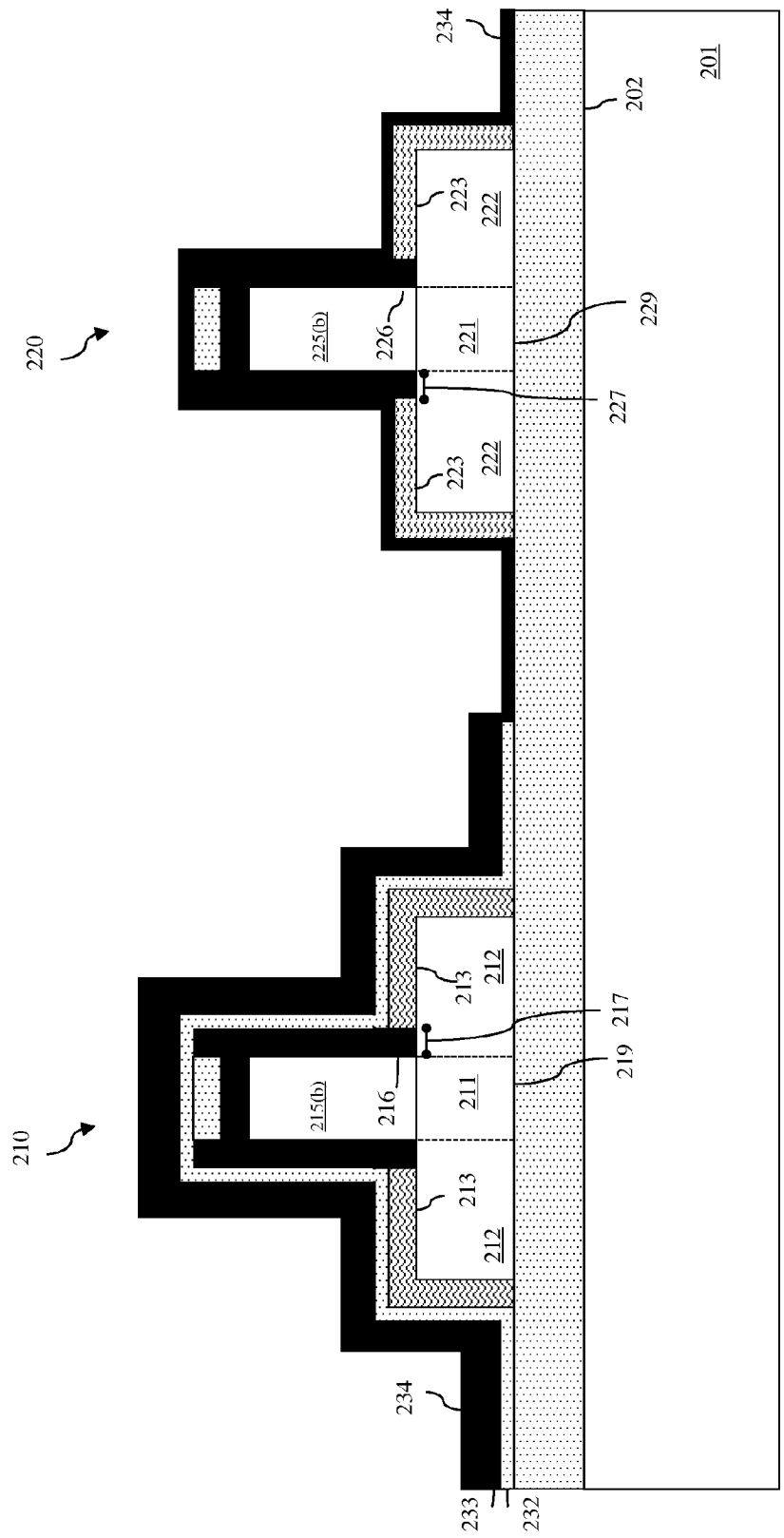
FIG. 12 is a partially completed CMOS structure formed according to the method of FIGS. 1A-1B.
Figure 13:
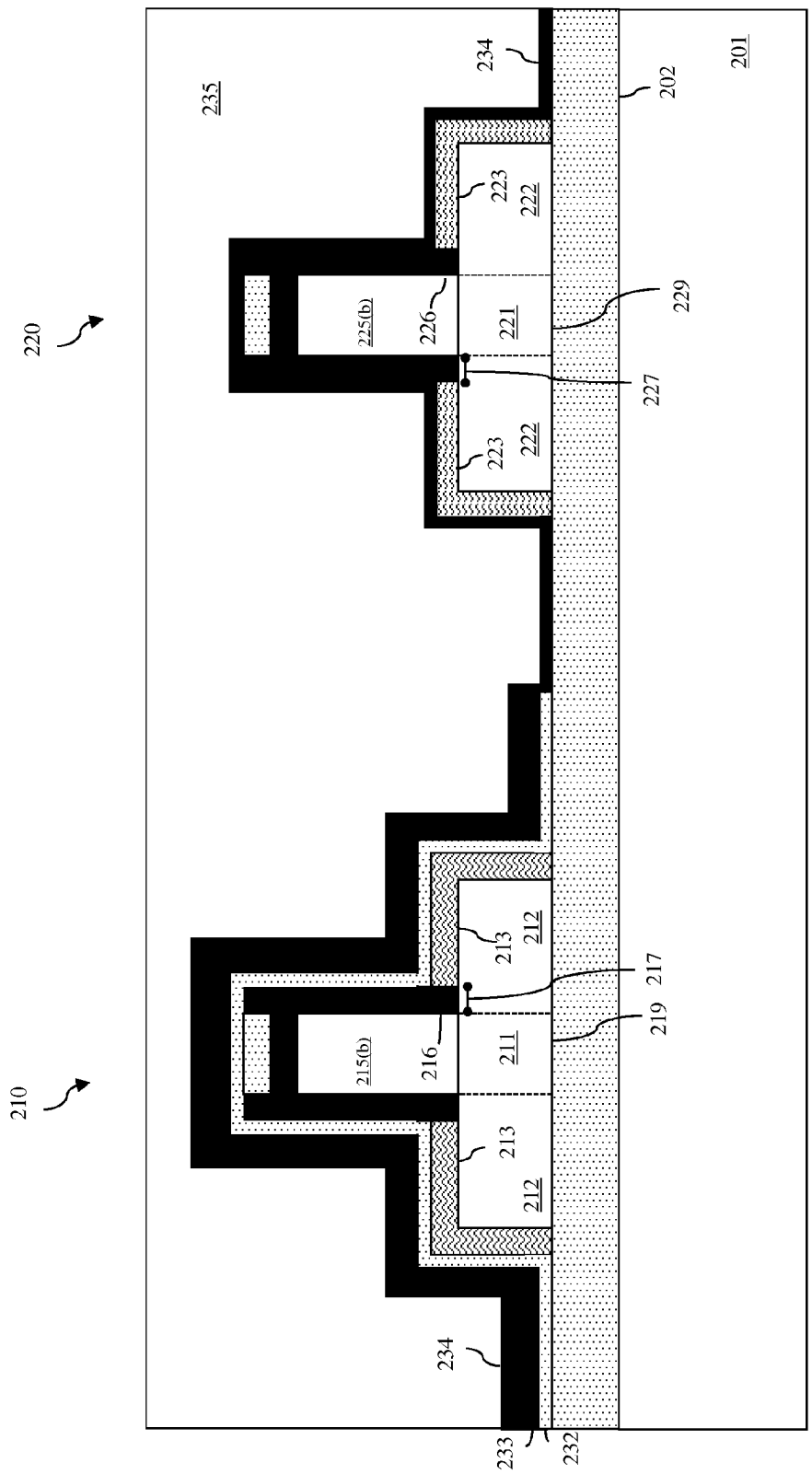
FIG. 13 is a partially completed CMOS structure formed according to the method of FIGS. 1A-1B.

Referring to FIG. 1B, in addition to the process steps described above, additional process steps can be performed in order to complete the CMOS structure and, in doing so, to optionally form dual silicides (i.e., different metal silicides) on the first and second raised source/drain regions of the first and second transistors, respectively. Specifically, a fourth dielectric layer 234 can be formed (e.g., conformally deposited) on the remaining portion of the third dielectric layer 233 above the first transistor 210 and further extending over the second raised source/drain regions 223, the second gate sidewall spacer 226 and the second gate structure 225(b) (132, see FIG. 12). The fourth dielectric layer 234 can comprise, for example, the same dielectric material as the first dielectric layer 231 and/or the third dielectric layer 233 and, more specifically, can comprise a different dielectric material than the second dielectric layer 232. For example, the fourth dielectric layer 234 can comprise a silicon nitride layer. A fifth dielectric layer 235 can then be formed so as to cover the fourth dielectric layer 234 (134). The fifth dielectric layer 235 can comprise, for example, a blanket layer of interlayer dielectric material. The interlayer dielectric material can comprise, for example, one or more layers of any of the following: borophosphosilicate glass (BPSG), phosphosilicate glass (PSG), boron silicate glass (BSG), undoped silicate glass (USG), or any other suitable interlayer dielectric material.

As mentioned above, the first and second gate structures formed at process 106 can comprise conventional gate structures 215(a) and 225(a), which will function as the final gate structures in the resulting CMOS structures such that they do not require further processing. However, in the event that the first and second gate structures formed at process 106 comprise dummy gate structures 215(b) and 225(b), additional processing can be performed following formation of the fifth dielectric layer 235 in order to replace the dummy gate structures 215(b) and 225(b) with replacement gate structures 218 and 228, respectively (e.g., replacement metal gate structures), which will function as the final gate structures for the resulting CMOS structure (136, see FIG. 14). To form replacement gate structures 218 and 228, the top of the dummy gate structures 215(b) and 225(b) can be exposed (e.g., using a chemical mechanical polishing (CMP) process) and the dummy gate structures 215(b) and 225(b) can be selectively removed (e.g., selectively etched away), creating trenches in the fifth dielectric layer 235, which are lined with the first gate sidewall spacer 216 and the second gate sidewall spacer 226, respectively. It should be noted that the dummy gate material, gate sidewall spacer material and interlayer dielectric material should be different materials so as to allow the dummy gate structures to be selectively removed. Subsequently, a first replacement gate structure 218 can be formed adjacent to the first channel region 211 of the first transistor 210 (e.g., the NFET) in the trench created by removal of the first dummy gate structure 215(b) and a second replacement gate structure 228 can be formed adjacent to the second channel region 221 of the second transistor 220 (e.g., the PFET) in the opening created by removal of the second dummy gate structure 225(b). Typically, the second transistor 220 (e.g., the PFET) will be masked during formation of the first replacement gate structure 218 and the first transistor 210 (e.g., the NFET) will be masked during formation of the second replacement gate structure 228 so as to allow different metal(s) or other conductive material(s) to be used as the gate conductor material(s) in the different FETs.

In any case, to form a replacement metal gate structure, one or more conformal gate dielectric layers can be deposited so as to line the trench created by removal of the dummy gate structure and one or more gate conductor layers, including at least one metal layer, can be deposited on the gate dielectric layer(s) to fill the trench. The gate dielectric layer can comprise, for example, a high-K gate dielectric layer such as a hafnium-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). The gate conductor layer(s) can comprise, for example, a first metal layer, which covers the gate dielectric layer(s) and which is a metal selected so as to have a specific work function appropriate for a given type FET (e.g., a NFET or a PFET). For example, for a silicon-based NFET, the first metal layer can comprise, for example, hafnium, zirconium, titanium, tantalum, aluminum, or alloys thereof, such as hafnium carbide, zirconium carbide, titanium carbide, tantalum carbide, or aluminum carbide, so as to have a work function similar to that of N-doped polysilicon. For a silicon-based PFET, the first metal layer can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so as to have a work function similar to that of P-doped polysilicon. The gate conductor layer(s) can further comprise a second metal layer. The second metal layer can comprise, for example, a metal fill material (e.g., tungsten or any other suitable metal fill material). Alternatively, any other suitable configuration of metal, metal alloys and/or doped polysilicon could be used for the gate conductor layer(s).

Following replacement gate structure formation at process 136, gate conductor and gate dielectric materials can be removed from the top surface of the fifth dielectric layer 235 (e.g., using a chemical mechanical polishing (CMP) process) and one or more additional dielectric layers can be formed above the fifth dielectric layer 235. For example, a relatively thin sixth dielectric layer 236 (e.g., yet another silicon nitride layer) can be formed on the fifth dielectric layer 235, covering the first replacement metal gate structure 218 and the second replacement metal gate structure 228. Optionally, the sixth dielectric layer 236 can be patterned (e.g., lithographically) and etched into discrete segments above each of the replacement gate structures (as shown). A seventh dielectric layer 237 can be deposited above the sixth dielectric layer 236. The seventh dielectric layer 237 can, like the fifth dielectric layer 235, comprise one or more layers of interlayer dielectric materials.

Figure 14:
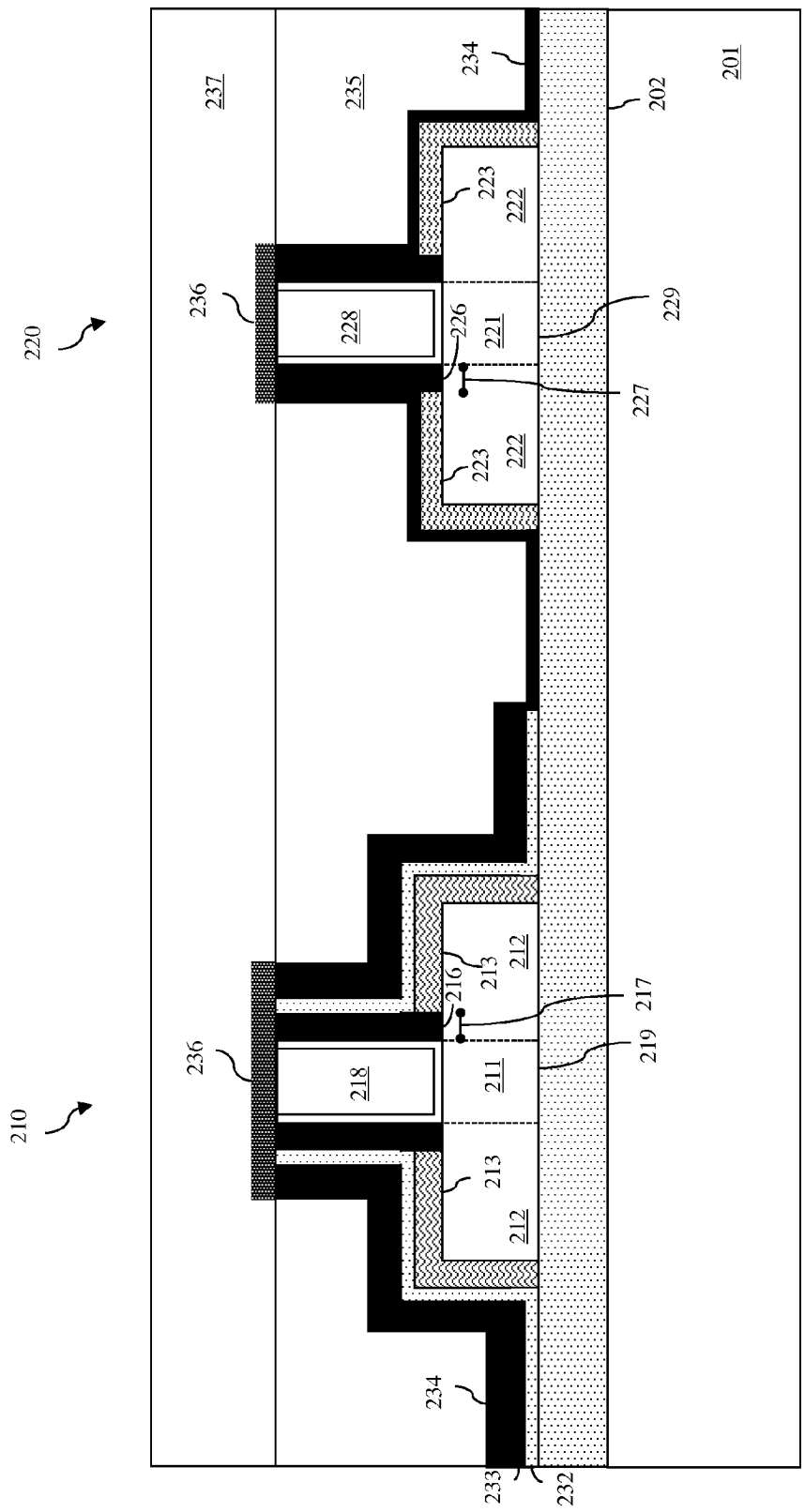
FIG. 14 is a partially completed CMOS structure formed according to the method of FIGS. 1A-1B.
Figure 15:
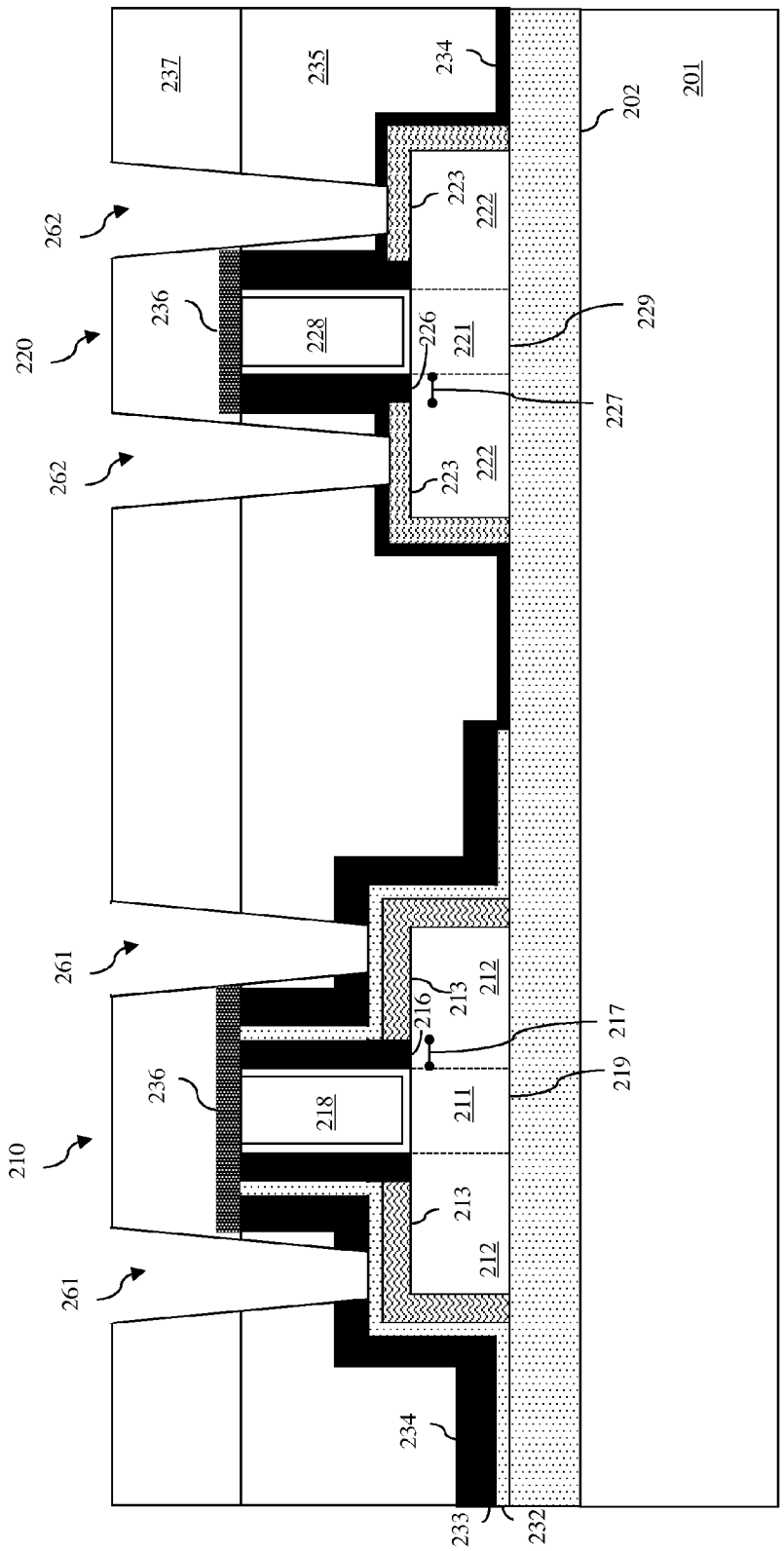
FIG. 15 is a partially completed CMOS structure formed according to the method of FIGS. 1A-1B.

In any case, once the final gate structures are formed (i.e., once either the conventional gate structures 215(a) and 225(a) (not shown) or the replacement gate structures 218 and 228 (as shown in FIG. 14) are formed) and interlayer dielectrics are formed above the final gate structures, multiple contact openings can formed (e.g., lithographically patterned and etched or otherwise formed), including first contact openings 261 to be used for first source/drain contacts for the first transistor 210 (e.g., the NFET) and second contact openings 262 to be used for second source/drain contacts for the second transistor 220 (138, see FIG. 15). Specifically, the multiple contact openings can be patterned such that the first contact openings 261 are aligned above the first raised source/drain regions 213 of the first transistor 210 (e.g., the NFET) and such that the second contact openings 262 are aligned above the second raised source/drain regions 223 of the second transistor 220 (e.g., the PFET). Additionally, etch processes can be performed so that the first contact openings 261 extend through the seventh dielectric layer 237 and the sixth dielectric layer 236 (if applicable, for example, if the sixth dielectric layer 236 is not patterned into segments or if the segments extend laterally beyond the gate structures), the fifth dielectric layer 235, the fourth dielectric layer 234, and the third dielectric layer 233, stopping on the second dielectric layer 232 (which functions as an etch stop layer), and so that the second contact openings 262 extend through the seventh dielectric layer 237 and sixth dielectric layer 236 (if applicable, for example, if the sixth dielectric layer 236 is not patterned into segments or if the segments extend laterally beyond the gate structures), the fifth dielectric layer 235 and the fourth dielectric layer 234 to the second raised source/drain regions 223. Thus, within the first contact openings 261, the top surfaces of the first raised source/drain regions 213 of the first transistor 210 (e.g., the NFET) remain protected (i.e., blocked) by the second dielectric layer 232, while within the second contact openings 262 the top surfaces of the second raised source/drain regions 223 are exposed.

Figure 16:
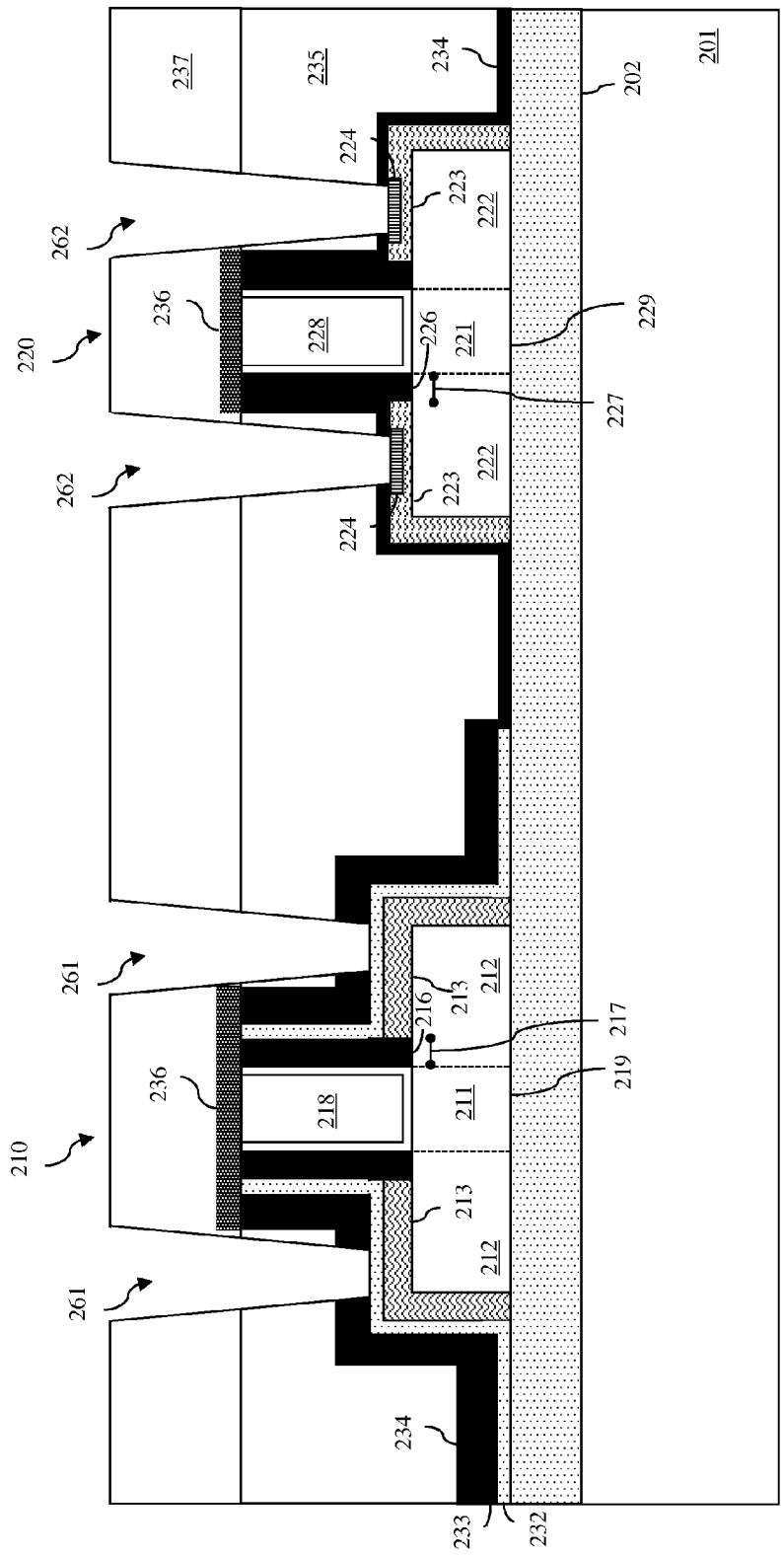
FIG. 16 is a partially completed CMOS structure formed according to the method of FIGS. 1A-1B.

Since at this stage only the top surfaces of the second raised source/drain regions 223 within the second contact openings 262 are exposed, metal silicide layers 224, which are optimal for use in the second transistor 220 (e.g., in the PFET), can be formed thereon without requiring the formation of yet another mask (i.e., yet another photoresist mask) to protect the first raised source/drain regions 213 from silicide formation (140, see FIG. 16). Specifically, at process 140, a conformal metal layer can be deposited over the structure such that it lines both the first contact openings 261 and the second contacts openings 262. Within the second contact openings 262, the conformal metal layer will be immediately adjacent to the second raised source/drain regions 223. An anneal process can then be performed in order to form metal silicide layers 224 on the exposed surfaces of the second raised source/drain regions 223 at the bottom of the second contact openings 262. The conformal metal layer can comprise, for example, a nickel or a nickel platinum alloy such that the resulting metal silicide layers 224 comprise a nickel silicide or a nickel platinum silicide, either of which is optimal for use in PFETs. Various metals or metal alloys that can be used to form a metal silicide that is optimal for use in PFETs include, but are not limited to, nickel, platinum, rhenium, rhodium, or cobalt or any alloy of nickel, platinum, rhenium, rhodium, and/or cobalt. Within each of the first contact openings 261, the conformal metal layer will be physically separated from the first raised source/drain regions 213 by the second dielectric layer 232, which effectively blocks metal silicide formation during the anneal. Following the anneal process, any remaining metal or metal alloy of the conformal metal layer that remains on the structure can be selectively removed.

Figure 17:
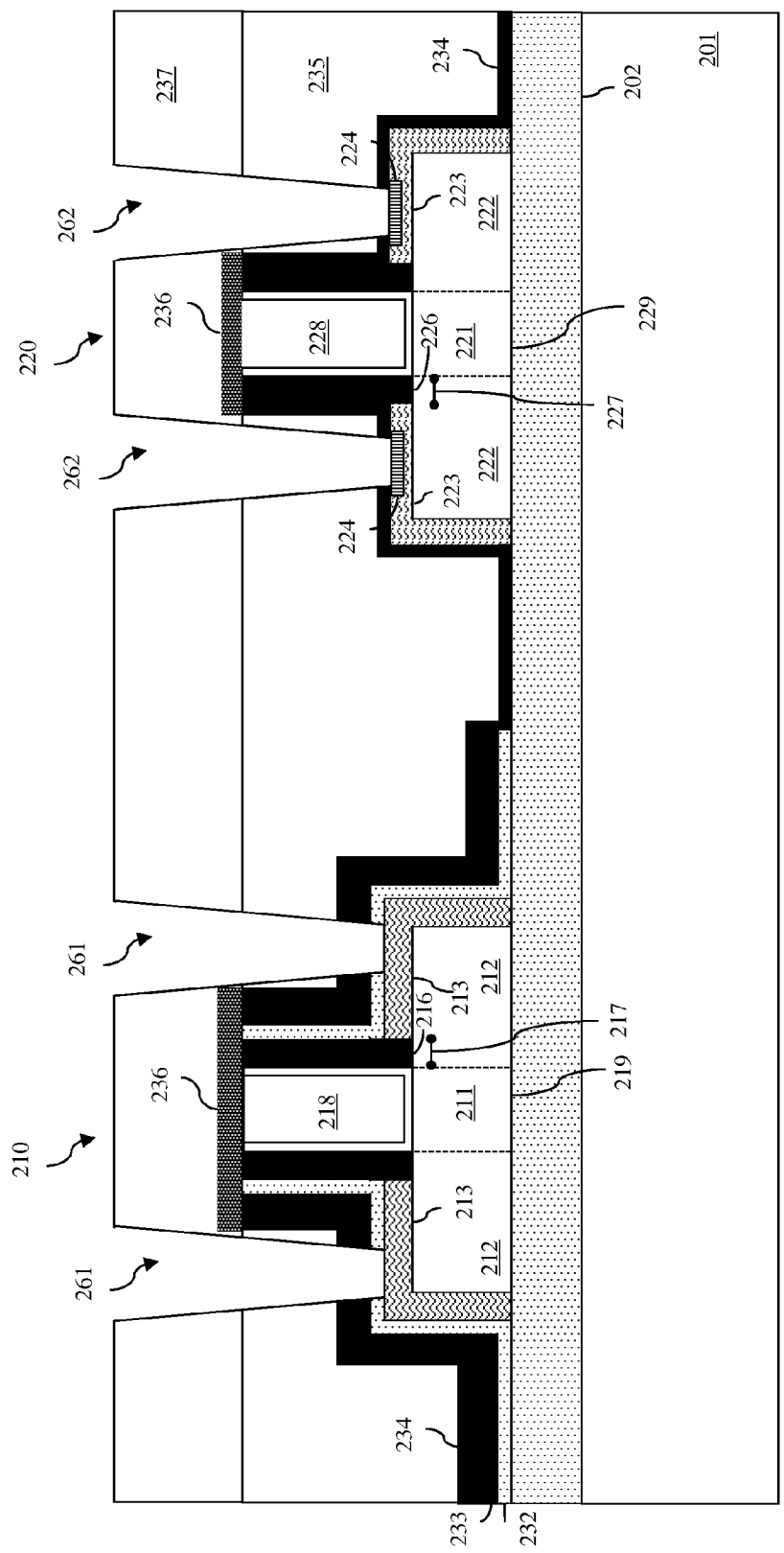
FIG. 17 is a partially completed CMOS structure formed according to the method of FIGS. 1A-1B.

Next, the bottoms of the first contact openings 261 can be opened up, exposing the top surfaces of the first raised source/drain regions 213 of the first transistor 210 (e.g., of the NFET) (142, see FIG. 17). That is, another etch process can be performed to extend the first contact openings 261 through the second dielectric layer 232 to the first raised source/drain regions 213.

Figure 18:
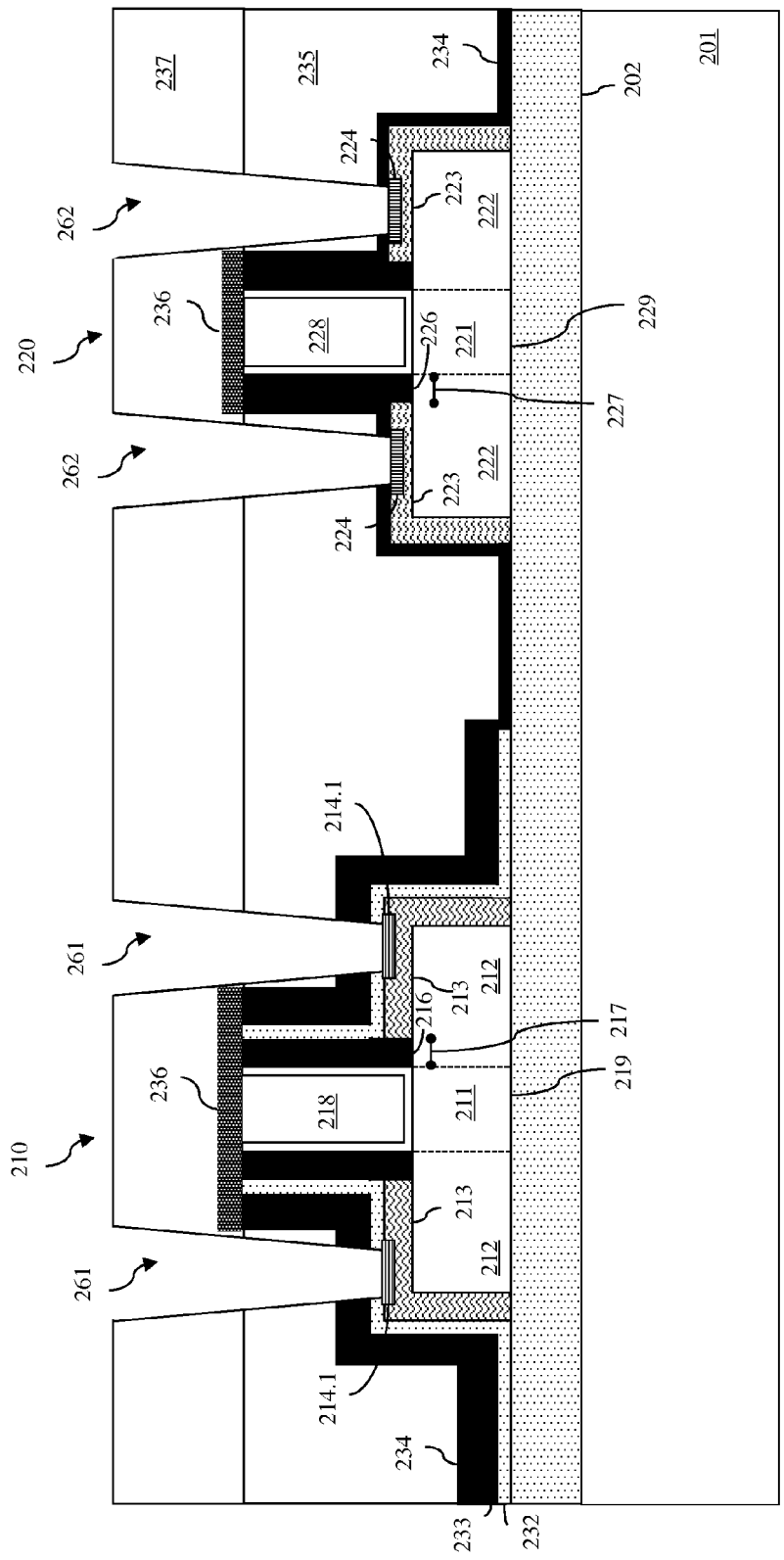
FIG. 18 is a partially completed CMOS structure formed according to the method of FIGS. 1A-1B.

Once the top surfaces of the first raised source/drain regions 213 are exposed, additional metal silicide layers 214.1, which are different from the metal silicide layers 224 on the second raised source/drain regions 223 and which are optimal for use in the first transistor 210 (e.g., in the NFET), can be formed thereon (144, see FIG. 18). For example, another conformal metal layer can be deposited so as to line the first contact openings 261 and the second contact openings 262. Within the first contact openings 261, the additional conformal metal layer will be immediately adjacent to the first raised source/drain regions 213. Another anneal process can be performed in order to form additional metal silicide layers 214.1 on the exposed surfaces of the first raised source/drain regions 213 at the bottom of the first contact openings 261. The metal or metal alloy used for the additional conformal metal layer can comprise a different metal or metal alloy than that used for the metal silicide layers 224 and, particularly, a metal or metal alloy that will form a metal silicide that is optimal for use in NFETs. Various metals or metal alloys that can be used to form a metal silicide that is optimal for use in NFETs include, but are not limited to, titanium, tantalum, hafnium, molybdenum, tungsten, or ytterbium or any alloy of titanium, tantalum, hafnium, molybdenum, tungsten, and/or ytterbium. Within each of the second contact openings 262, the additional conformal metal layer will be physically separated from the second raised source/drain regions 223 by the metal silicide layers 224, which effectively block any additional metal silicide formation on the second raised source/drain regions 223.

Figure 19:
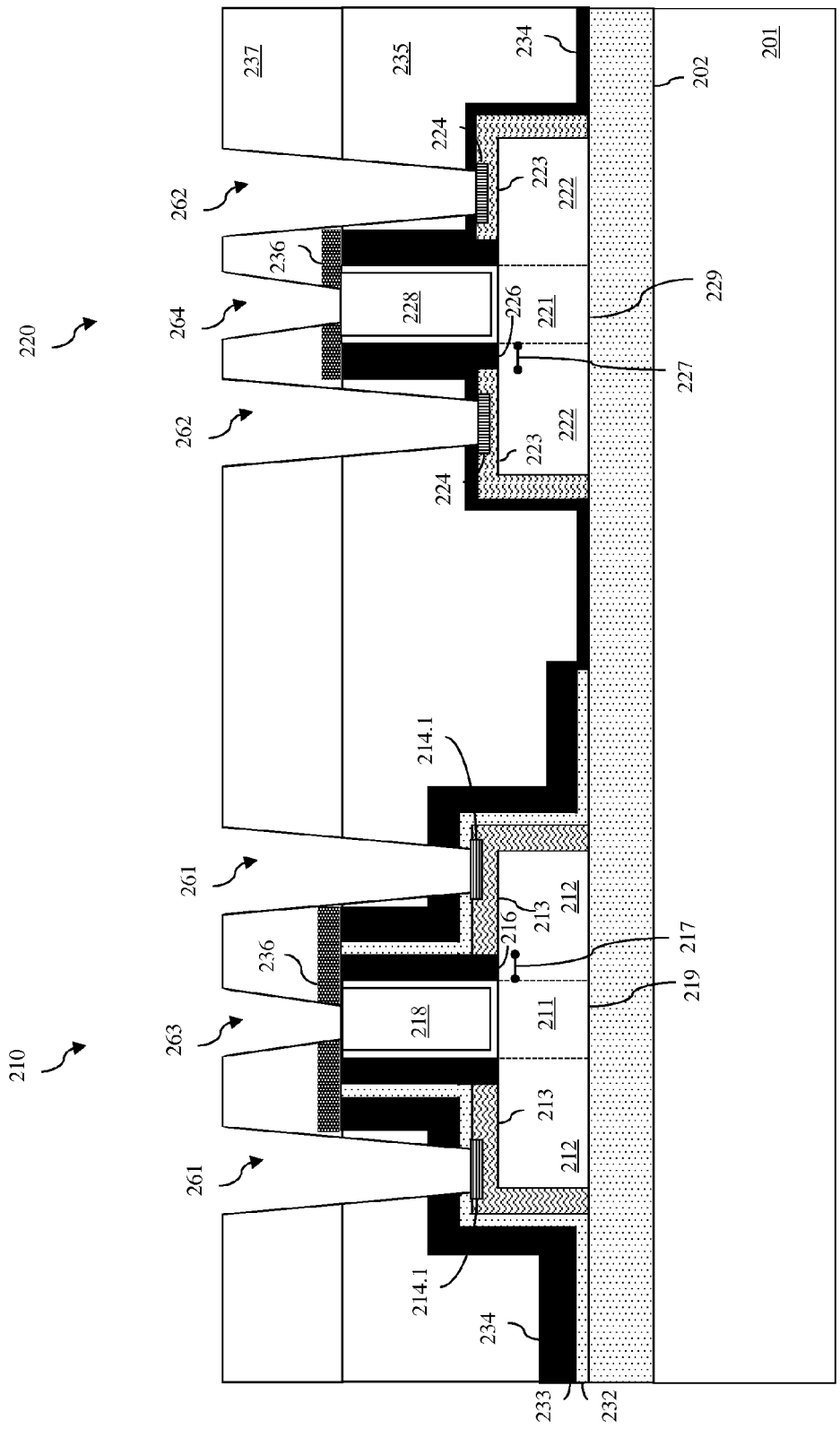
FIG. 19 is a partially completed CMOS structure formed according to the method of FIGS. 1A-1B.

Following the additional anneal process, any metal or metal alloy of the additional conformal metal layer that remains on the structure can be selectively removed. Following formation of the additional metal silicide layers 214.1 on the first raised source/drain regions 213 of the first transistor 210 (e.g., the NFET), additional processing can be performed to complete the CMOS structure 200A (146, see FIGS. 19-20). The additional processing can include, but is not limited to, forming additional contact openings 263 and 264 to the final gate structures (e.g., to the first and second replacement gates 218, 228, as shown in FIG. 19); lining all contact openings 261-264 with one or more metal liners 271, which form conductive barrier and/or adhesion layers (e.g., a first metal liner comprising titanium, tantalum, etc. and, optionally, a second metal liner on the first metal liner and comprising, for example, a metal alloy such as titanium nitride, tantalum nitride or tungsten nitride); filling all of the contact openings 261-264 with a fill metal 272 (e.g., tungsten or other suitable fill metal) to form first contacts 281, second contacts 282 and additional contacts 283 and 284 in the first contact openings 261, second contact openings 262 and additional contact openings 263 and 264, respectively; performing a chemical mechanical polishing (CMP) to remove all conductive materials from above the seventh dielectric layer 237; performing back end of the line (BEOL) processing (not shown), etc. (see CMOS structure 200A of FIG. 20).

Alternatively, after the metal silicide layers 224 are formed on the second raised source/drain regions 223 at process 140, the processes of extending the first contact openings 261 through the second dielectric layer 232 to exposed the first raised source/drain regions 213 of the first transistor 210 (e.g., the NFET) and of forming additional metal silicide layers on exposed surfaces of first raised source/drain regions 213 can be integrated with some of the additional processing described above for completing a CMOS structure.

Figure 21:
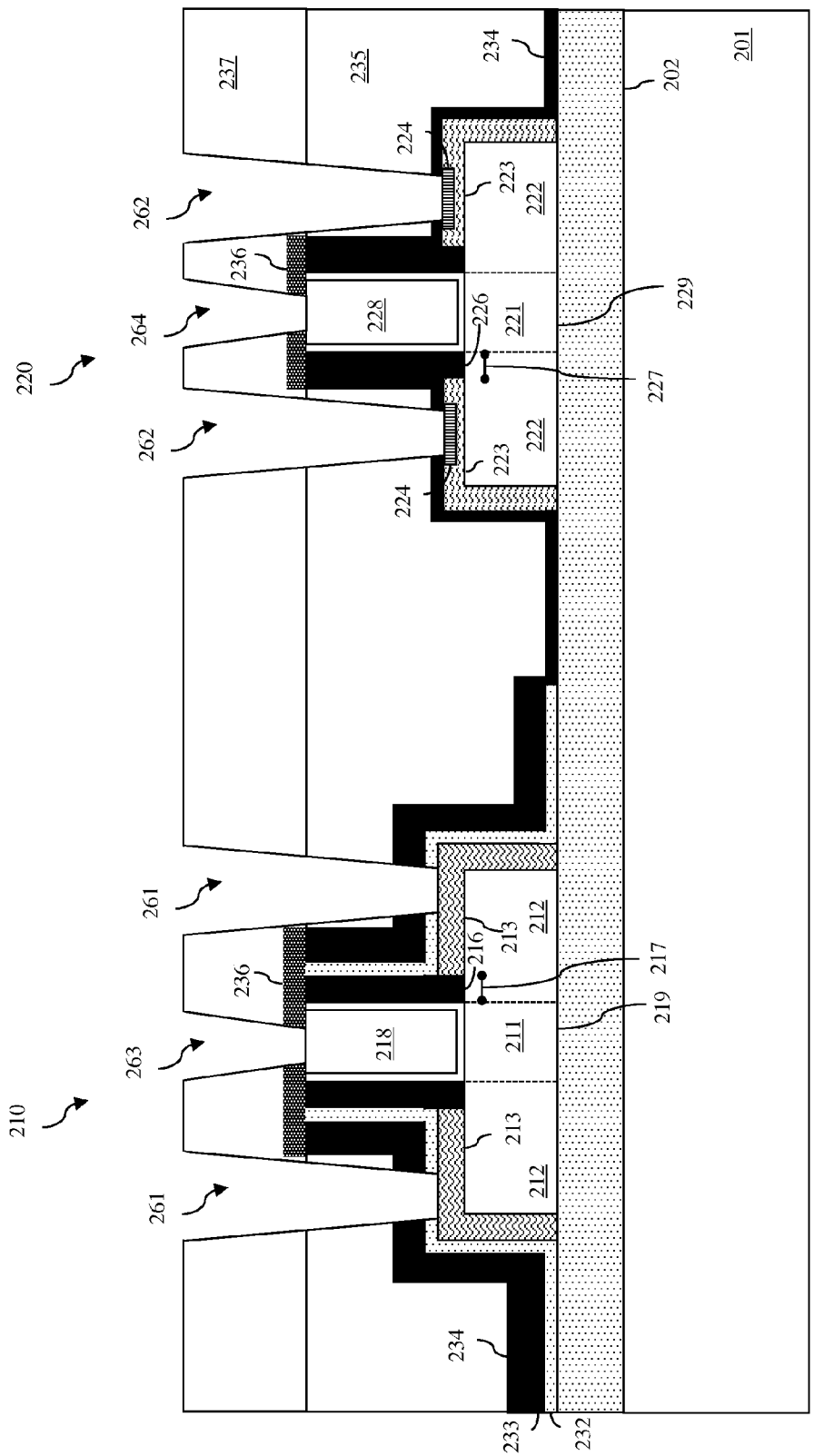
FIG. 21 is a partially completed CMOS structure formed according to the method of FIGS. 1A-1B.

For example, after the metal silicide layers 224 are formed on the second raised source/drain regions 223 at process 140, additional contact openings 263 and 264 can be formed (e.g., lithographically patterned and etched) through the seventh dielectric layer 237 and the sixth dielectric layer 236 to the gate structures of the first transistor 210 (e.g., the NFET) and the second transistor 220 (e.g., the PFET) and, particularly, to the final gate structures of these transistors (e.g., to either conventional first and second gate structures or to replacement gate structures, as applicable) (148, see FIG. 21). During formation of these additional contact openings 263 and 264, the bottoms of the first contact openings 261 can be opened up, exposing the top surfaces of the first raised source/drain regions 213 of the first transistor 210 (e.g., of the NFET). That is, the first contact openings 261 can be extended through the second dielectric layer 232. Next, all of the contact openings 261-264 can be lined with one or more metal liners 271, which function as conductive barrier and/or adhesion layers, and filled with a fill metal 272 to form first contacts 281, second contacts 282 and additional contacts 283 and 284 in the first contact openings 261, second contact openings 262 and additional contact openings 263 and 264, respectively (150, see FIG. 22). In this case, the metal liner(s) 271 can comprise at least a first metal liner comprising an additional conformal metal layer that will be immediately adjacent to the first raised source/drain regions 213 and that will inherently form additional metal silicide layers 214.2 at the metal-silicon interfaces at the bottoms of the first contact openings 261. Thus, the first metal liner of the metal liner(s) 271 can be preselected so that it comprises a metal or metal alloy that is a different metal or metal alloy than that used to form the metal silicide layers 224 and, particularly, a metal or metal alloy that can perform the desired barrier and/or adhesion function within the contacts 281-284 and that will also form metal silicide layers 214.2 that are optimal for use in NFETs. For example, the first metal liner can comprise titanium or tantalum such that the additional metal silicide layers 214.2 comprise titanium silicide or tantalum silicide. Various metals or metal alloys that can be used to form the metal liner(s) 271 and that are optimal for use in metal silicides of NFETs include, but are not limited to, titanium, tantalum, hafnium, molybdenum, tungsten, or ytterbium or any alloy of titanium, tantalum, hafnium, molybdenum, tungsten, and/or ytterbium. Optionally, the metal liner(s) 271 can further comprise a second metal liner on the first metal liner and comprising, for example, a metal alloy such as titanium nitride, tantalum nitride or tungsten nitride. The fill metal 272 can comprise, for example, tungsten or any other suitable fill metal material(s).

Figure 22:
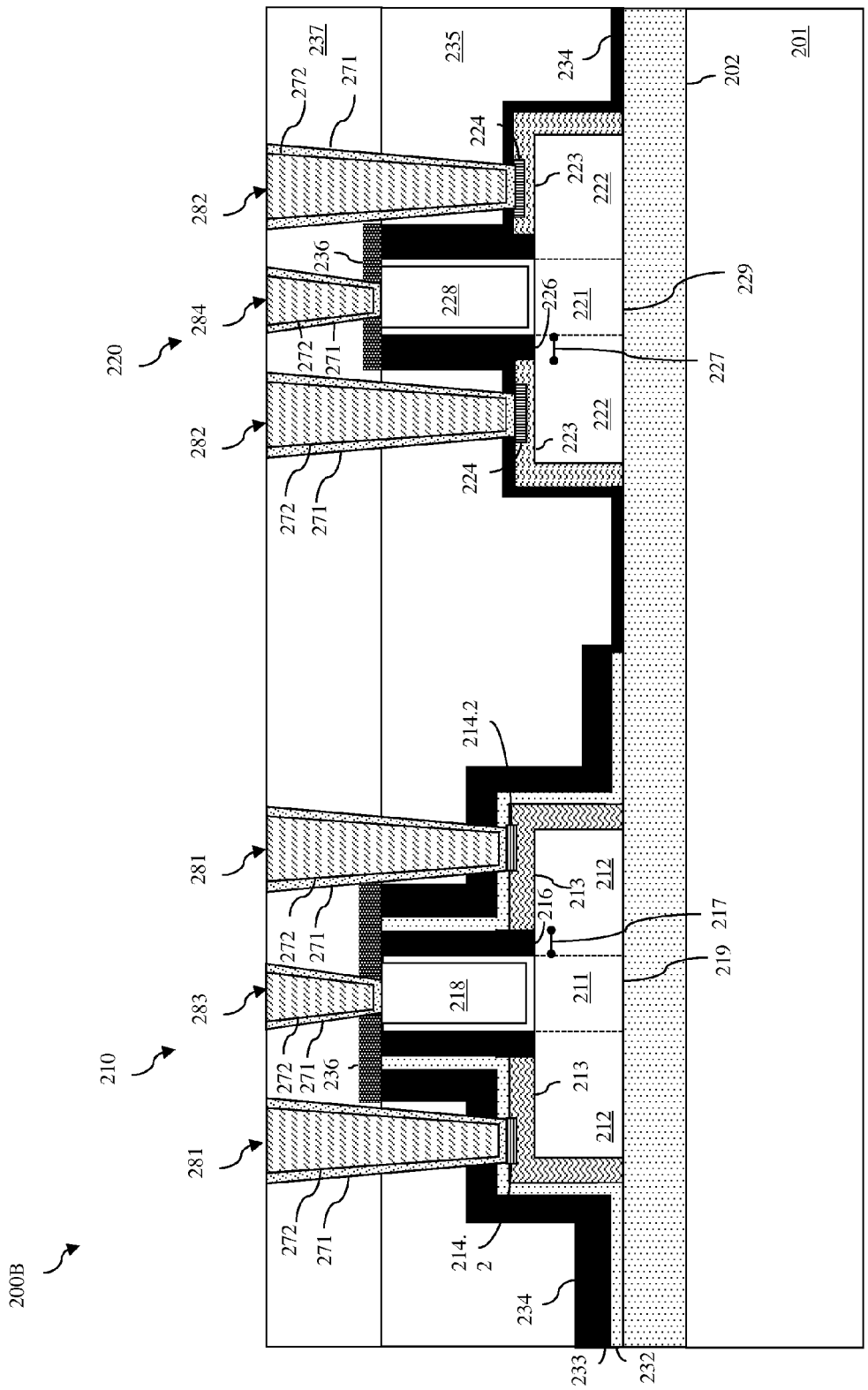
FIG. 22 is an alternative CMOS structure formed according to the method of FIGS. 1A-1B.

Following formation of the contacts 281-284, additional processing can be performed to complete the CMOS structure 200B (152, see FIG. 22). This additional processing can comprise, for example, performing a chemical mechanical polishing (CMP) to remove conductive materials from above the seventh dielectric layer 237 (see FIG. 21); performing back end of the line (BEOL) processing (not shown), etc. (see CMOS structure 200B of FIG. 22).

Figure 20:
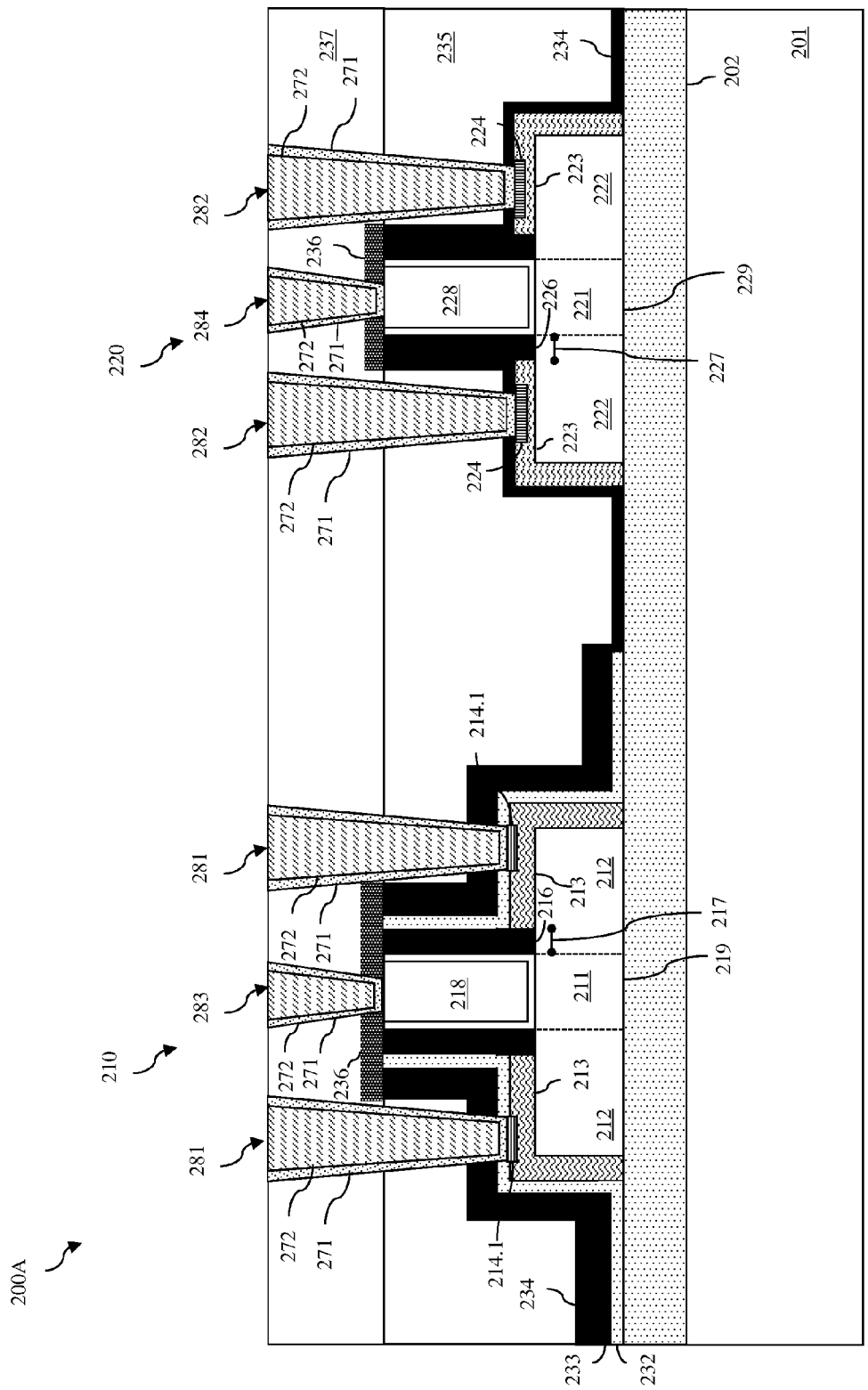
FIG. 20 is a CMOS structure formed according to the method of FIGS. 1A-1B.

It should be noted that resulting CMOS structures 200A of FIGS. 20 and 200B of FIG. 22 are essentially identical, except the processing techniques used to form the CMOS structure 200A allows for more flexibility with regard to the metal used to form the additional metal silicide layer 214.1. Specifically, since the technique used to form the CMOS structure 200A of FIG. 20 includes discrete processing steps for forming the metal silicide layers 224 on the second raised source/drain regions 223 of the second transistor 220 (e.g., the PFET), for forming the additional metal silicide layers 214.1 on the first raised source/drain regions 213 of the first transistor 210 (e.g., the NFET), and for forming the metal liner 271 in the contact openings 261-264, the metal silicide layers 224 and additional metal silicide layers 214.1 can comprise different metals (i.e., different metal silicides) and the metal liner 271 can also comprise a different metal from that used in the metal silicide layers 224 and/or the additional metal silicide layers 214.1. Contrarily, since the technique used to form the CMOS structure 200B of FIG. 22 integrates the process steps for forming the additional metal silicide layers 214.2 and for forming the metal liner 271 of the contacts, the metal silicide layers 224 and the additional metal silicide layers 214.2 can comprise different metals (i.e., different metal silicides); however, the additional metal silicide layers 214.2 will comprise the same metal as that used in the metal liner 271.

Referring to FIGS. 20 and 22, also disclosed herein are embodiments of a semiconductor structure and, particularly, a complementary metal oxide semiconductor (CMOS) structure 200A and 200B formed according to the method described above. The CMOS structure 200A, 200B can be formed on a semiconductor-on-insulator (SOI) wafer comprising, for example, a semiconductor substrate 201 (e.g., a silicon substrate or any other suitable semiconductor substrate), an insulator layer 202 (e.g., a silicon dioxide layer, a silicon nitride layer, a silicon oxynitride layer or any other suitable insulator layer) on the semiconductor substrate 201 and a semiconductor layer (e.g., a silicon layer, a silicon germanium layer, or any other suitable semiconductor layer) on the insulator layer 202. Alternatively, it can be formed on a bulk semiconductor wafer comprising, for example, a bulk semiconductor substrate (e.g., a bulk silicon substrate or any other suitable bulk semiconductor substrate). In the case of a bulk semiconductor wafer, a buried well region can isolate the upper portion of the substrate from the lower portion of the substrate. For purposes of illustration, this CMOS structure 200A, 200B is described below and illustrated in the Figures with respect to an SOI wafer.

The CMOS structure 200A, 200B can comprise multiple FETs above the substrate 201. These FETs can comprise non-planar FETs, such as dual-gate FETs (also referred to herein as finFETs) or tri-gate FETs. Alternatively, the transistors can comprise planar FETs such as extremely thin silicon-on-insulator FETs. For purposes of illustration, the CMOS structure embodiments are described below and illustrated in the Figures as comprising non-planar FETs. The multiple FETs can comprise at least a first transistor 210 and a second transistor 220, having different type conductivities (e.g., a N-type field effect transistor (NFET) and a P-type field effect transistor (PFET)).

The first transistor 210 (e.g., the NFET) can comprise at least one first semiconductor body 219. In the case of a non-planar FET, this first semiconductor body can comprise a non-planar semiconductor body (also referred to herein as a semiconductor fin). The first semiconductor body 219 can comprise first source/drain regions 212 and a first channel region 211 between the first source/drain regions 212. The first transistor 210 can further comprise a first gate structure (e.g., a first replacement gate structure 218, as illustrated, or, alternatively, a first conventional gate structure (not shown)), which is positioned adjacent the first semiconductor body 219 (e.g., on the top surface and, in the case of a non-planar semiconductor body, also on the opposing sides) at the first channel region 211. A first gate sidewall spacer 216 can be positioned adjacent to the sidewalls of the first gate structure 218. The first transistor 210 can further comprise first raised source/drain regions 213 on the first source/drain regions 212 such that the first gate sidewall spacer 216 is positioned between the first raised source/drain regions 213 and the first gate structure 218. The first raised source/drain regions 213 can comprise first epitaxial silicon layers on the first semiconductor body 219 (e.g., on the top surface and, in the case of a non-planar semiconductor body, also on the opposing sides) at the first source/drain regions 212. The first epitaxial silicon layers can be in situ doped with a first dopant and, specifically, with a N-type dopant (e.g., a Group V dopant, such as arsenic, phosphorous or antimony) such that the first raised source/drain regions 213 are N-type raised source/drain regions.

The second transistor 220 (e.g., the PFET) can comprise at least one second semiconductor body 229. In the case of a non-planar FET, this second semiconductor body can comprise a non-planar semiconductor body (also referred to herein as a semiconductor fin). The second semiconductor body 229 can comprise second source/drain regions 222 and a second channel region 221 between the second source/drain regions 222. The second transistor 220 can further comprise a second gate structure (e.g., a second replacement gate structure 228, as illustrated, or, alternatively, a second conventional gate structure (not shown)), which is positioned adjacent the second semiconductor body 229 (e.g., on the top surface and, in the case of a non-planar semiconductor body, also on the opposing sides) at the second channel region 221. A second gate sidewall spacer 226 can be positioned adjacent to the sidewalls of the second gate structure 228. The second transistor 210 can further comprise second raised source/drain regions 223 on the second source/drain regions 222 such that the second gate sidewall spacer 226 is positioned between the second raised source/drain regions 223 and the second gate structure 228. The second raised source/drain regions 223 can comprise second epitaxial silicon layers on the second semiconductor body 229 (e.g., on the top surface and, in the case of a non-planar semiconductor body, also on the opposing sides) at the second source/drain regions 222. The second epitaxial silicon layers can be in situ doped with a second dopant, which is different from the first dopant, and specifically with a P-type dopant (e.g., a Group III dopant, such as boron or indium) such that the second raised source/drain regions 223 are P-type raised source/drain regions.

In the above-described first and second transistors 210, 220, the first gate sidewall spacer 216 of the first transistor 210 and the second gate sidewall spacer 226 of the second transistor 220 can comprise discrete portions of the same first dielectric layer (e.g., a silicon nitride layer), as described in detail above with regard to the method. Thus, the first gate sidewall spacer 216 and the second gate sidewall spacer 226 have approximately equal thicknesses (i.e., the first gate sidewall spacer 216 has a first thickness 217 and the second gate sidewall spacer 226 has a second thickness 227 that is approximately equal to the first thickness 217) and the first raised source/drain regions 213 are separated from the first channel region 211 and the second raised source/drain regions 223 are separated from the second channel region 221 by approximately equal distances. Thus, the first transistor 210 (e.g., the NFET) and the second transistor 220 (e.g., the PFET) also have symmetric source/drain junctions (i.e., the source/drain junctions of the FETs will have approximately equal lengths and, thereby approximately equal resistances).

The CMOS structure 200A, 200B can further comprise a plurality of additional dielectric layers. The additional dielectric layers can comprise at least a second dielectric layer 232, a third dielectric layer 233 and a fourth dielectric layer 234, each of which are conformal dielectric layers. Specifically, the second dielectric layer 232 can be above the first transistor 210 (e.g., the NFET) and, specifically, can be immediately adjacent to the first raised source/drain regions 213 of the first transistor 210 without extending over the second transistor 220 (e.g., the PFET). The third dielectric layer 233 can be on the second dielectric layer 232 above the first transistor 210, again without extending over the second transistor 220. The fourth dielectric layer 234 can be on the third dielectric layer 233 and, thereby above the first transistor 210 and can also extend laterally over the second transistor 220 so as to be immediately adjacent to the second raised source/drain regions 223. The second dielectric layer 232 can specifically comprise a different dielectric material than that used for the first dielectric layer (the remaining portions of which form the first gate sidewall spacer 216 and the second gate sidewall spacer 226), the third dielectric layer 233 and the fourth dielectric layer 234. For example, the second dielectric layer 232 can comprise a silicon dioxide layer and the first dielectric layer, third dielectric layer 233 and fourth dielectric layer 234 can each comprise silicon nitride layers.

The additional dielectric layers can also comprise, for example, a fifth dielectric layer 235 above the fourth dielectric layer 234, a sixth dielectric layer 236 above the fifth dielectric layer 235 and a seventh dielectric layer 237 above the sixth dielectric layer 236. The fifth dielectric layer 235 can comprise, for example, a blanket layer of interlayer dielectric material. The interlayer dielectric material can comprise, for example, any of the following: borophosphosilicate glass (BPSG), phosphosilicate glass (PSG), boron silicate glass (BSG), undoped silicate glass (USG), or any other suitable interlayer dielectric material. The sixth dielectric layer 236 can comprise, for example, yet another silicon nitride layer and can, for example, be immediately adjacent to the top surface of the gate structures (e.g., replacement metal gate structures 218 and 228). Optionally, the sixth dielectric layer 236 can be patterned (e.g., lithographically) and etched into discrete segments above each of the replacement gate structures (as shown). The seventh dielectric layer 237 can, like the fifth dielectric layer 235, comprise a blanket layer of interlayer dielectric material.

Optionally, the first transistor 210 (e.g., the NFET) and the second transistor 220 (e.g., the PFET) can have dual silicides (i.e., different metal silicides on the first raised source/drain regions 213 and the second raised source/drain regions 223, respectively). More specifically, metal silicide layers 224 can be on the second raised source/drain regions 223 of the second transistor 220 (e.g., the NFET) and additional metal silicide layers 214.1 (see CMOS structure 200A of FIG. 20) or 214.2 (see CMOS structure 200B of FIG. 22) can be on the first raised source/drain regions 213 of the first transistor 210 (e.g., the NFET). The metal silicide layers 224 on the second raised source/drain regions 223 can be optimal metal silicide layers for use in the second transistor 220 (e.g., the PFET). Various metals or metal alloys that can be used to form the metal silicide layers 224, during processing as described above, such that the metal silicide layers 224 are optimal for use in PFETs include, but are not limited to, nickel, platinum, rhenium, rhodium, or cobalt or any alloy of nickel, platinum, rhenium, rhodium, and/or cobalt. The additional metal silicide layers 214.1 or 214.2 on the first raised source/drain regions 213 can be optimal metal silicide layers for use in the first transistor 210 (e.g., the NFET) and, specifically, can be different from the metal silicide layers 224. Various metals or metal alloys that can be used to form the additional metal silicide layers 214.1 of FIG. 20 or 214.2 of FIG. 22, during processing as discussed in detail above, such that the additional metal silicide layers are optimal for use in NFETs include, but are not limited to, titanium, tantalum, hafnium, molybdenum, tungsten, or ytterbium or any alloy of titanium, tantalum, hafnium, molybdenum, tungsten, and/or ytterbium.

The CMOS structure 200A, 200B can further comprise multiple contacts that extend to the source/drain regions and the gate structure of the transistors 210, 220. Specifically, these contacts can comprise first contacts 281, second contacts 282 and additional contacts 283-284. The first contacts 281 can extend through the seventh dielectric layer 237, the sixth dielectric layer 236, if applicable (e.g., if the sixth dielectric layer 236 is not patterned into segments or if the segments extend laterally beyond the gate structures, as discussed above), the fifth dielectric layer 235, the fourth dielectric layer 234, the third dielectric layer 233 and the second dielectric layer 232 to the additional metal silicide layers 214.1 (as shown in FIG. 20) or 214.2 (as shown in FIG. 22) on the first raised source/drain regions 213 of the first transistor 210 (e.g., the NFET). The second contacts 282 can extend through the seventh dielectric layer 237, the sixth dielectric layer 236, if applicable (e.g., if the sixth dielectric layer 236 is not patterned into segments or if the segments extend laterally beyond the gate structures, as discussed above), the fifth dielectric layer 235 and the fourth dielectric layer 234 to the metal silicide layers 224 on the second raised source/drain regions 223 of the second transistor 220 (e.g., the PFET). The additional contact 283 and 284 can extend through the seventh dielectric layer 237 and the sixth dielectric layer 236 to the top surface of the gate structures (e.g., the replacement gate structures 218 and 228), respectively.

Each of the contacts 281-284 can comprise a contact opening. The contact opening can be lined with one or more metal liners 271 that function as conductive barrier and/or adhesion layers. The metal liner(s) 271 can comprise at least a first metal liner. In the first contacts 281, this first metal liner can be positioned immediately adjacent to the additional metal silicide layers and, in the second contacts 282, this first metal liner can be positioned immediately adjacent to the metal silicide layers. Optionally, the metal liner(s) 271 can further comprise a second metal liner on the first metal liner. The contact opening can further be filled with a fill metal 272 on the metal liner(s) 271.

It should be noted that CMOS structures 200A of FIGS. 20 and 200B of FIG. 22 are essentially identical, except, as described in detail above with regard to the method, the processing techniques used to form the CMOS structure 200A allows for greater flexibility with regard to the metal used to form the additional metal silicide layer 214.1.

For example, in the CMOS structure 200A of FIG. 20, the metal silicide layers 224 and additional metal silicide layers 214.1 can comprise different metals (i.e., different metal silicides) and the metal liner 271 and, particularly, the first metal liner can also comprise a different metal from that used in either the metal silicide layers 224 or the additional metal silicide layers 214.1. Specifically, the metal silicide layers 224 can comprise nickel silicide layers, nickel platinum silicide layers or any other metal silicide layer suitable for use in a PFET, as discussed above. The additional metal silicide layers 214.1 can comprise titanium silicide layers, tantalum silicide layers, chromium silicide layers, cobalt silicide layers, palladium silicide layers, molybdenum silicide layers, tungsten silicide layers, or any other metal silicide layer suitable for use in an NFET, as discussed above. The first metal liner 271, which is immediately adjacent to these silicide layers, can comprise a titanium liner or a tantalum liner and the second metal liner on the first metal liner can comprise, for example, a metal alloy such as titanium nitride, tantalum nitride or tungsten nitride.

In the CMOS structure 200B of FIG. 22, the metal silicide layers 224 and the additional metal silicide layers 214.2 can comprise different metals (i.e., different metal silicides); however, the additional metal silicide layers 214.2 will comprise the same metal as that used in the metal liner 271 and, particularly, in the first metal liner. For example, the metal silicide layers 224 can comprise nickel silicide layers or nickel platinum silicide layers or any other metal silicide layer suitable for use in a PFET, as discussed above. The additional metal silicide layers 214.2 can comprise a metal silicide layer suitable for use in a NFET, as discussed above, an the metal liner 271 and, particularly, the first metal liner can comprise a liner formed from the same metal. For example, the additional metal silicide layers 214.2 can comprise titanium silicide layers and the first metal liner, which is immediately adjacent to the additional metal silicide layers 214.2, can comprise a titanium liner. Alternatively, the additional metal silicide layers 214.2 can comprise tantalum silicide layers and the first metal liner, which is immediately adjacent to the additional metal silicide layers 214.2, can comprise a tantalum liner, and so on.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 23:
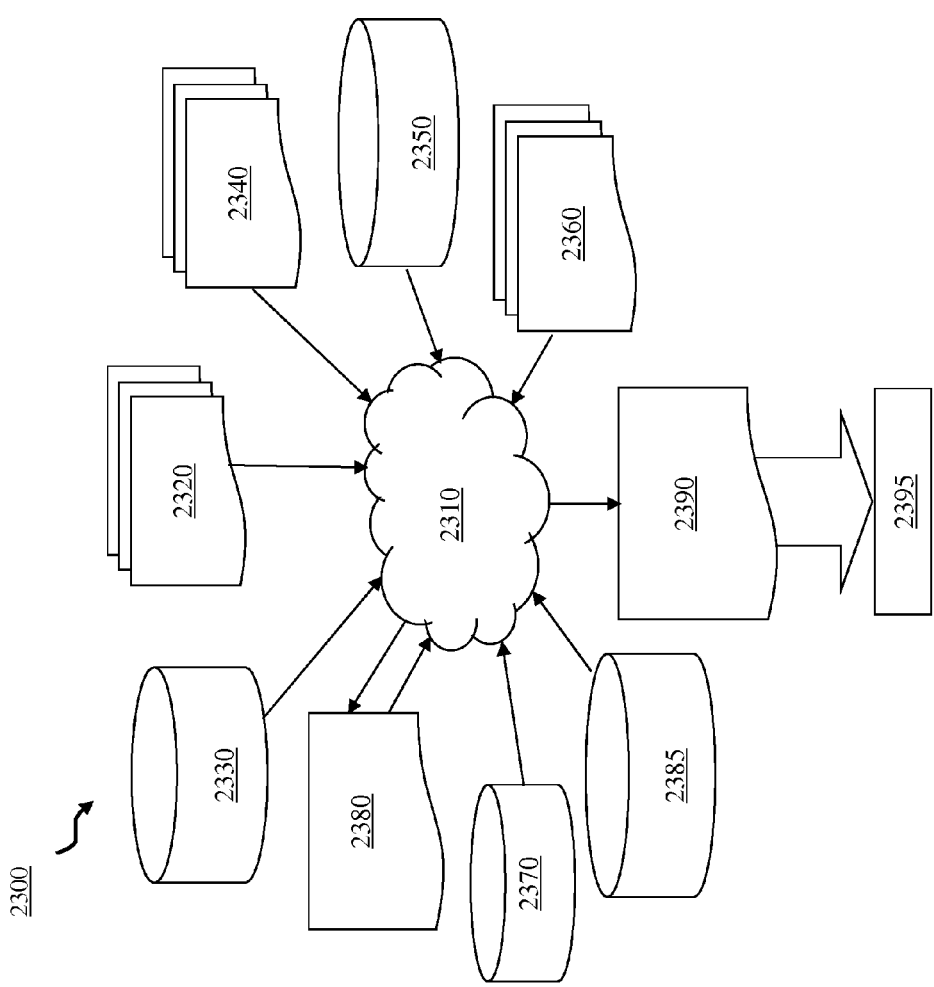
FIG. 23 shows a block diagram of an exemplary design flow used, for example, in design, simulation, test, layout, and manufacture of the CMOS structure of FIG. 20 or FIG. 22; and, FIG. 24 is a schematic diagram illustrating a representative hardware environment (i.e., a computer system) for implementing the above-described design flow of FIG. 23.

FIG. 23 shows a block diagram of an exemplary design flow 2300 used for example, in semiconductor IC logic design, simulation, test, layout, and manufacture of a CMOS structure 200A of FIG. 20 or 200B of FIG. 22. Design flow 2300 includes processes, machines and/or mechanisms for processing design structures or devices to generate logically or otherwise functionally equivalent representations of the design structures and/or devices described above and shown in FIGS. 20 and 22. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 23 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in 20 and 22. As such, design structure 2320 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 20 and 22 to generate a Netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include hardware and software modules for processing a variety of input data structure types including Netlist 2380. Such data structure types may reside, for example, within library elements 2330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2340, characterization data 2350, verification data 2360, design rules 2370, and test data files 2385 which may include input test patterns, output test results, and other testing information. Design process 2310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2310 without deviating from the scope and spirit of the invention. Design process 2310 may also include modules for performing standard circuit design processes such as timing analysis, verification, design rule checking, place and route operations, etc.

Design process 2310 employs and incorporates logic and physical design tools such as HDL compilers and simulation model build tools to process design structure 2320 together with some or all of the depicted supporting data structures along with any additional mechanical design or data (if applicable), to generate a second design structure 2390. Design structure 2390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2320, design structure 2390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 20 and 22. In one embodiment, design structure 2390 may comprise a compiled, executable HDL simulation model that functionally simulates the devices shown in FIGS. 20 and 22.

Design structure 2390 may also employ a data format used for the exchange of layout data of integrated circuits and/or symbolic data format (e.g. information stored in a GDSII (GDS2), GL1, OASIS, map files, or any other suitable format for storing such design data structures). Design structure 2390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 20 and 22. Design structure 2390 may then proceed to a stage 2395 where, for example, design structure 2390: proceeds to tape-out, is released to manufacturing, is released to a mask house, is sent to another design house, is sent back to the customer, etc.

Figure 24:
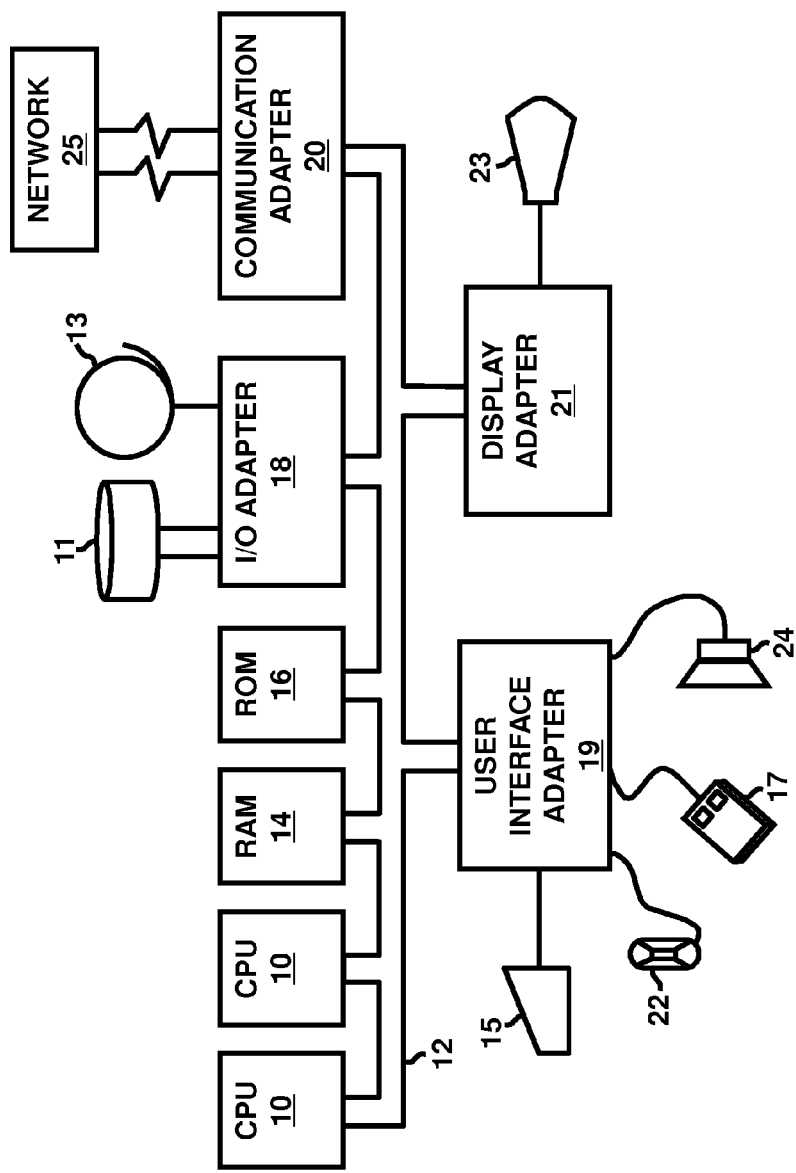

A representative hardware environment (i.e., a computer system) for implementing the above-described design flow is depicted in FIG. 24. This schematic drawing illustrates a hardware configuration of an information handling/computer system in accordance with the embodiments herein. The system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method of forming a semiconductor structure comprising:
    forming a first dielectric layer comprising a first section and a second section, said first section being over a first gate structure on a first semiconductor body of a first transistor and said second section being over a second gate structure on a second semiconductor body of a second transistor;

forming a mask on said second section of said first dielectric layer;

etching said first section of said first dielectric layer to form a first gate sidewall spacer on said first gate structure and to expose first source/drain regions of said first semiconductor body;

forming first raised source/drain regions on said first source/drain regions such that said first gate sidewall spacer is between said first raised source/drain regions and said first gate structure;

removing said mask;

forming a second dielectric layer on said first gate structure, said first gate sidewall spacer and said first semiconductor body, said second dielectric layer further extending over said second section of said first dielectric layer;

forming a third dielectric layer on said second dielectric layer;

forming an additional mask on said third dielectric layer above said first gate structure, said first gate sidewall spacer and said first raised source/drain regions;

etching said third dielectric layer and said second dielectric layer to expose said second section of said first dielectric layer;

etching said second section of said first dielectric layer to form a second gate sidewall spacer on said second gate structure and to expose second source/drain regions of said second semiconductor body; and, forming second raised source/drain regions on said second source/drain regions such that said second gate sidewall spacer is between said second raised source/drain regions and said second gate structure.

2. The method of claim 1, said first gate sidewall spacer and said second gate sidewall spacer having approximately equal thicknesses such that said first raised source/drain regions are separated from a first channel region in said first semiconductor body and said second raised source/drain regions are separated from a second channel region in said second semiconductor body by approximately equal distances.

3. The method of claim 1,
said forming of said first raised source/drain regions comprising epitaxially depositing a first epitaxial silicon layer on said first source/drain regions and, during said epitaxially depositing of said first epitaxial silicon layer, in situ doping said first epitaxial silicon layer with a first dopant, and
said forming of said second raised source/drain regions comprising epitaxially depositing a second epitaxial silicon layer on said second source/drain regions and, during said epitaxially depositing of said second epitaxial silicon layer, in situ doping said second epitaxial silicon layer with a second dopant that is different from said first dopant.

4. The method of claim 1, said second dielectric layer comprising a different dielectric material than said first dielectric layer and said third dielectric layer.

5. The method of claim 1, said first transistor comprising a N-type field effect transistor and said second transistor comprising a P-type field effect transistor.

6. A method of forming a semiconductor structure comprising:
forming a first dielectric layer comprising a first section and a second section, said first section being over a first gate structure on a first semiconductor body of a first transistor and said second section being over a second gate structure on a second semiconductor body of a second transistor;

forming a mask on said second section of said first dielectric layer;

etching said first section of said first dielectric layer to form a first gate sidewall spacer on said first gate structure and to expose first source/drain regions of said first semiconductor body;

forming first raised source/drain regions on said first source/drain regions such that said first gate sidewall spacer is between said first raised source/drain regions and said first gate structure;

removing said mask;

forming a second dielectric layer on said first gate structure, said first gate sidewall spacer and said first semiconductor body, said second dielectric layer further extending over said second section of said first dielectric layer;

forming a third dielectric layer on said second dielectric layer;

forming an additional mask on said third dielectric layer above said first gate structure, said first gate sidewall spacer and said first raised source/drain regions;

etching said third dielectric layer and said second dielectric layer to expose said second section of said first dielectric layer;

etching said second section of said first dielectric layer to form a second gate sidewall spacer on said second gate structure and to expose second source/drain regions of said second semiconductor body; and, forming second raised source/drain regions on said second source/drain regions such that said second gate sidewall spacer is between said second raised source/drain regions and said second gate structure;

removing said additional mask;

forming a fourth dielectric layer on a remaining portion of said third dielectric layer above said first transistor, said fourth dielectric layer further extending over said second raised source/drain regions, said second gate sidewall spacer and said second gate structure;

forming multiple contact openings comprising:
first contact openings aligned above said first raised source/drain regions and extending to said second dielectric layer; and
second contact openings aligned above and extending to said second raised source/drain regions;

forming a conformal metal layer in said first contact openings and said second contact openings;

performing an anneal to form metal silicide layers on exposed surfaces of said second raised source/drain regions in said second contact openings; and, after said metal silicide layers are formed, extending said first contact openings through said second dielectric layer to said first raised source/drain regions.

7. The method of claim 6, further comprising: selectively removing said conformal metal layer and forming additional metal silicide layers different from said metal silicide layers on said first raised source/drain regions.

8. The method of claim 6, further comprising:
selectively removing said conformal metal layer;
forming additional contact openings aligned above and extending to gate structures, said first contact openings being extended through said second dielectric layer to said first raised source/drain regions during said forming of said additional contact openings;

forming an additional conformal metal layer in said first contact openings, said second contact openings and said additional contact openings, said additional conformal metal layer creating additional metal silicide layers different from said metal silicide layers on said first raised source/drain regions; and filling said first contact openings, said second contact openings and said additional contact openings with a fill metal.

9. The method of claim 6, said first gate sidewall spacer and said second gate sidewall spacer having approximately equal thicknesses such that said first raised source/drain regions are separated from a first channel region of said first transistor and said second raised source/drain regions are separated from a second channel region of said second transistor by approximately equal distances.

10. The method of claim 6, said forming of said first raised source/drain regions comprising epitaxially depositing a first epitaxial silicon layer on said first source/drain regions and, during said epitaxially depositing of said first epitaxial silicon layer, in situ doping said first epitaxial silicon layer with a first dopant, and said forming of said second raised source/drain regions comprising epitaxially depositing a second epitaxial silicon layer on said second source/drain regions and, during said epitaxially depositing of said second epitaxial silicon layer, in situ doping said second epitaxial silicon layer with a second dopant that is different from said first dopant.

11. The method of claim 6, said second dielectric layer comprising a different dielectric material than said first dielectric layer, said third dielectric layer and said fourth dielectric layer.

\* \* \* \* \*